US007134099B2

(12) United States Patent
Collins et al.

(10) Patent No.: US 7,134,099 B2
(45) Date of Patent: Nov. 7, 2006

(54) ESD DESIGN, VERIFICATION AND CHECKING SYSTEM AND METHOD OF USE

(75) Inventors: David S. Collins, Williston, VT (US); Donald L. Jordan, Weybridge, VT (US); Sue E. Strang, Burlington, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 10/605,960

(22) Filed: Nov. 10, 2003

(65) Prior Publication Data

US 2005/0102644 A1    May 12, 2005

(51) Int. Cl.
*G06F 17/50* (2006.01)
(52) U.S. Cl. .............................. 716/1; 716/10; 716/11
(58) Field of Classification Search .................... 716/1, 716/9–13
See application file for complete search history.

(56) References Cited

U.S. PATENT DOCUMENTS

| 6,466,423 B1* | 10/2002 | Yu ............................. 361/56 |
| 6,502,229 B1* | 12/2002 | Lee et al. ....................... 716/12 |
| 6,594,809 B1* | 7/2003 | Wang et al. .................. 716/10 |
| 6,704,179 B1* | 3/2004 | Voldman ...................... 361/56 |
| 6,862,723 B1* | 3/2005 | Wang et al. ................... 716/13 |
| 2004/0225985 A1* | 11/2004 | Kashiwagi et al. ........... 716/10 |

OTHER PUBLICATIONS

Sue E. Strang, et al., "A Design System for Auto-Generation of ESD Circuits", International Cadence Usergroup Conference, Sep. 16-18, 2002, San Jose, California.

* cited by examiner

*Primary Examiner*—Paul Dinh
(74) *Attorney, Agent, or Firm*—Richard M. Kotulak, Esq.; Greenblum & Bernstein, P.L.C.

(57) ABSTRACT

A computerized method and system for designing, verification and checking of the electrostatic discharge (ESD) protection circuits and their implementation in a integrated computer chip design where the computer chip comprises of electronic circuits designed in a parameterized cell design system, pads, interconnects and the ESD system uses a hierarchical system of parameterized cells (p-cells) which are constructed into higher level ESD networks. Lowest order p-cells pass user defined parameters to higher order p-cells to form an ESD protection circuit meeting design criteria. Ones of the p-cells are "grow-able" such that they can form repetition groups of the underlying p-cell element to accommodate the design parameters. Layout and circuit schematics are auto-generated with the user varying the number of elements in the circuit by adjusting the input parameters. The circuit topology automation allows for the customer to auto generate new ESD circuits and ESD power clamps without additional design work.

31 Claims, 27 Drawing Sheets

P-Cell Network Creation and Placement

P-Cell Schematic and Graphical Representation

Graphical Representation of Hierarchical Design

Symbol for D-C trigger clamp

Symbol representation
Variations of styles –
for type of ESD element

ESD Interconnect P-Cell : Ballasting Feature in P-Cell to provide Current Uniformity ESD Interconnect P-Cell : Cheesing Feature widening of metal in P-Cell for ESD robustness

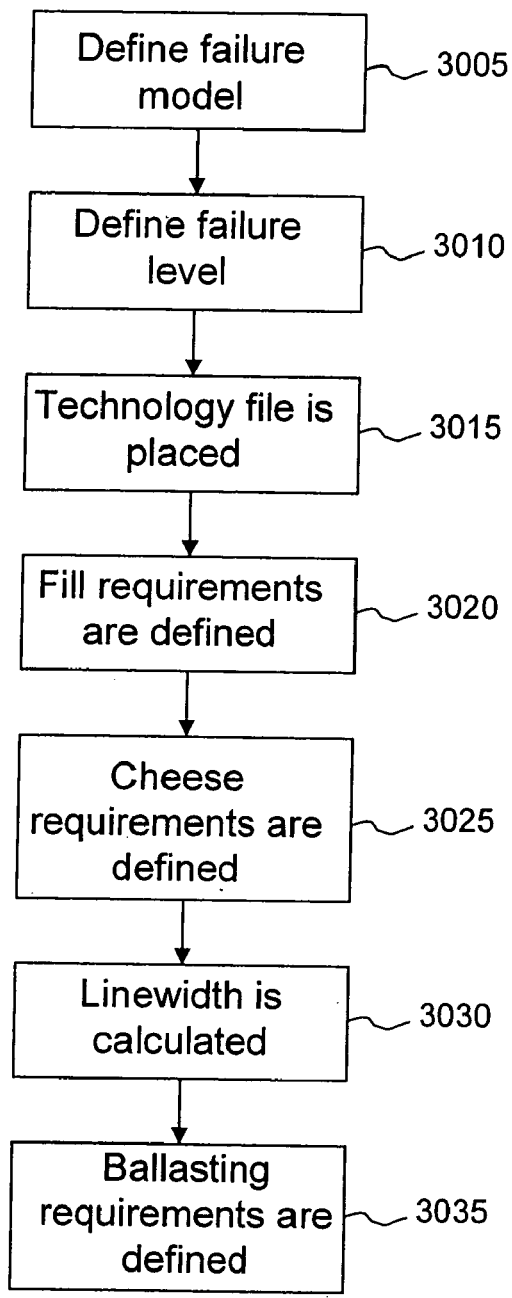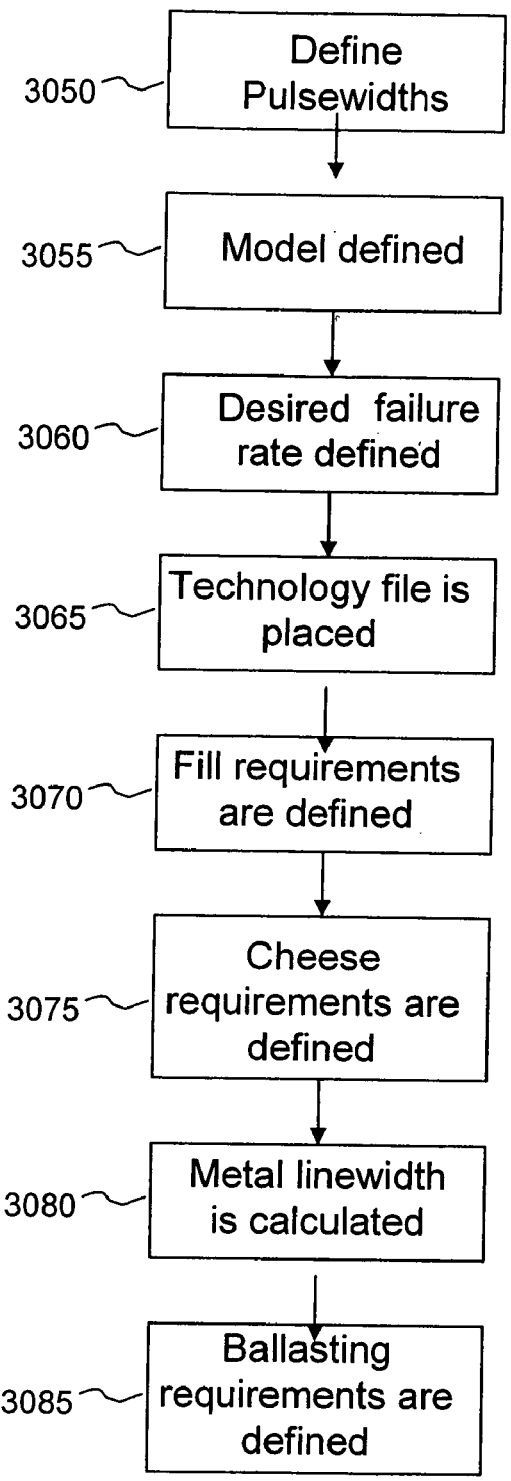
Figure 29a
Figure 29b

ESD DESIGN, VERIFICATION AND CHECKING SYSTEM AND METHOD OF USE

BACKGROUND OF INVENTION

1. Field of the Invention

The invention generally relates to a electrostatic discharge (ESD) design system and method of use and, more particularly, to an automated computer aided design (CAD) system and method of use for design, verification and checking of ESD circuits for a given application.

2. Background Description

As electronic components become smaller and smaller along with the internal structures in integrated circuits, it is becoming easier to either completely destroy or otherwise impair electronic components. In particular, many integrated circuits are highly susceptible to damage from the discharge of static electricity, even at levels which can neither be seen nor felt. This is typically referred to as electrostatic discharge (ESD), in which the transfer of an electrostatic charge occurs between bodies at different electrostatic potentials (voltages) caused by direct contact or induced by an electrostatic field.

The discharge of static electricity, or ESD, has become a critical problem for the electronics industry. Device failures are not always immediately catastrophic, but often the device is weakened thus less able to withstand normal operating stresses and, hence, may result in a reliability problem. Therefore, various ESD protection circuits must be included in the device to protect the various components, with various considerations necessary for ESD protection circuits.

For example, ESD protection circuits for input nodes must support quality dc, ac, and RF model capability in order to co-design ESD circuits for analog and RF circuits. With the growth of the high-speed data rate transmission, optical interconnect, wireless and wired marketplaces, the breadth of applications and requirements is broad. Each type of application space has a wide range of power supply conditions, number of independent power domains, and circuit performance objectives. As a result, an ESD design system which has dc and RF characterized models, design flexibility, automation, ESD characterization, and satisfies digital, analog and RF circuits is required to design and co-synthesize ESD needs of mixed signal RF technology.

Much effort has been expended by industry to protect electronic devices from ESD damage. Traditionally, ESD designs are custom designed using graphical systems. ESD ground rules and structures are typically built into the designs requiring a custom layout. This has lead to custom design for digital products such as, for example, DRAMs, SRAMs, microprocessors, ASIC development and foundry technologies. This design practice does not allow for the flexibility needed for RF applications.

A difficulty in the design of RF ESD solutions is that traditionally, specific designs are fixed in size in order to achieve verifiable ESD results for a technology. The difficulty with analog and RF technology is that a wide range of circuit applications exists where one ESD size structure is not suitable due to loading of the circuit. A second issue is that the co-synthesis of the circuits must be done to properly evaluate the RF performance objectives. RF characterization of the network that is flexible with the device size is important for the evaluation of the tradeoffs of RF performance and ESD.

A third issue for RF mixed signal designs, there are analog and digital circuits. In these environments, there are some products which primarily use digital CMOS circuits and some which are bipolar dominated. In this environment, some applications prefer CMOS-based ESD networks, and others are motivated to use Bipolar-based ESD networks.

Additional difficulties are encountered from the different views of an ESD circuit (e.g., symbol, circuit schematic and graphical representations) and the mapping from the graphical to circuit representations, circuit schematic representation to the graphical representation in the environment of a variable ESD circuit sizes. New solutions are developed to provide a methodology and structure to allow flexibility of mapping between representations in the environment of these different size elements.

In this environment, the verification and checking is necessary to evaluate ESD chip robustness. This may include, for example, the verification of the pads, the ESD input circuit, the ESD power clamp circuit, ESD rail-to-rail circuits, interconnects between the input pad and the ESD circuits, interconnects between power pads and the ESD power rails, the interconnects between two power rails for rail-to-rail ESD networks, the verification of ESD rail-to-rail type designs between functional blocks, verification of type of ESD networks on analog, digital and RF circuits, verification of the correct ESD network for a given chip circuit, verification of the critical size of the interconnects, verification of the size and adequacy of the ESD network are all important to provide ESD protection of RF BiCMOS, RF BiCMOS Silicon Germanium (hereinafter referred generally as BiCMOS) and RF CMOS applications.

SUMMARY OF INVENTION

In a first aspect of the invention, a computerized ESD circuit design system includes a user interface for inputting a plurality of design parameters of a circuit and an ESD kit comprising parameterized cells (p-cells) of low level electronic components and p-cells of higher level electronic circuit components. The higher level electronic circuit components include growable and non-growable segments. A circuit schematic module creates ESD elements for connection with the circuit based on the plurality of design parameters and using at least one of the low level electronic circuit components and higher level electronic circuit components.

In another aspect, a method of forming an electrostatic discharge (ESD) protection design includes forming a kit of parameterized cells (p-cells) modeling elements of an ESD protection device; providing an input variable set; providing a computer interface for allowing a user to input parameters for said input variable set; forming a higher order ESD protection circuit from said p-cells based on said parameters; and outputting said higher order ESD protection circuit in one of a circuit layout and a circuit schematic graphical format.

In still another aspect of the invention, a computer program product comprising a computer usable medium having readable program code embodied in the medium is provided. The computer program product includes, in no specific order:

1. a component to verify a connection between a pad and an ESD network by verifying and checking electrical connectivity;

2. a component to verify the width requirements to maintain ESD robustness to a minimum level;

3. a component to verify that based on the ESD robustness of the ESD network that the interconnect width and via number is such to avoid electrical interconnect failure prior to the ESD network failure;

4. a component to provide for multiple lines in parallel whose cross section can be maintained and evaluated as a set of parallel interconnect connected to a single ESD network or plurality of ESD networks;

5. a component to provide for "ESD ballasting" by dividing into a plurality of lines;

6. a component to provide for calculation of the ESD robustness of the interconnect based on pulse width, surrounding insulator materials (e.g., SiO2 or low K materials), metal level and distance from the substrate (thermal resistance based on the metal level or underlying structures);

7. a component to provide for surrounding fill shapes; and 8. a component to provide for and adjust for cheesing of the interconnect.

BRIEF DESCRIPTION OF DRAWINGS

FIGS. 29a and 29b show flowcharts implementing a method for allowing for calculation of the ESD robustness in accordance with the invention.

DETAILED DESCRIPTION

The invention relates to a system and method for designing ESD elements (circuits). The invention also relates to verification and checking of such circuits, ensuring the robustness of the ESD circuit and accompanying design. In the design phase, layout and circuit schematics are auto-generated with the user capable of varying the number of parameters, i.e., elements, in the circuit. The ESD design system allows for change of circuit topology as well as structure size in an automated fashion, without additional design work. Interconnects and wiring between the circuit elements are also auto-generated with use of the invention.

The invention is suitable for an ESD CAD strategy that provides design flexibility, RF characterization and models of ESD elements, automation, and choice of ESD network type. The environment employed may use a hierarchical system of parameterized cells, referred to as "p-cells", which are constructed into higher level ESD networks. The parameterized cells, or "p-cells", can be constructed in a commercially available CAD software environment such as, for example, CADENCE® design system to form a kit. The p-cells are "grow-able" elements such that they can form repetition groups of the underlying p-cell element to accommodate many different design parameters. The p-cells fix some variables, and pass some variables to the higher order p-cell circuits through inheritance. From base p-cells, ESD circuits are constructed for input pads, VDD-to-VSS power clamps, and VSS-to-VSS power clamps and the like.

The automated ESD design system has the ability to adjust the design size and the number of elements. In digital circuits, for example, the design decision is typically based on the digital dc voltage separation required between the grounds. In RF circuits, for example, the design issue is the capacitive coupling at high frequency. As more elements are added, capacitive coupling is reduced. In the ESD design system, the interconnects and wires are capable of automatically stretching and scaling with the structure size. As elements are added, both the graphical layout and physical schematics introduce the elements maintaining the electrical interconnects and pin connection. The invention maintains a library of several types of ESD circuits which may be placed into an already created circuit.

Design System and Method of the Invention

Figure 1:
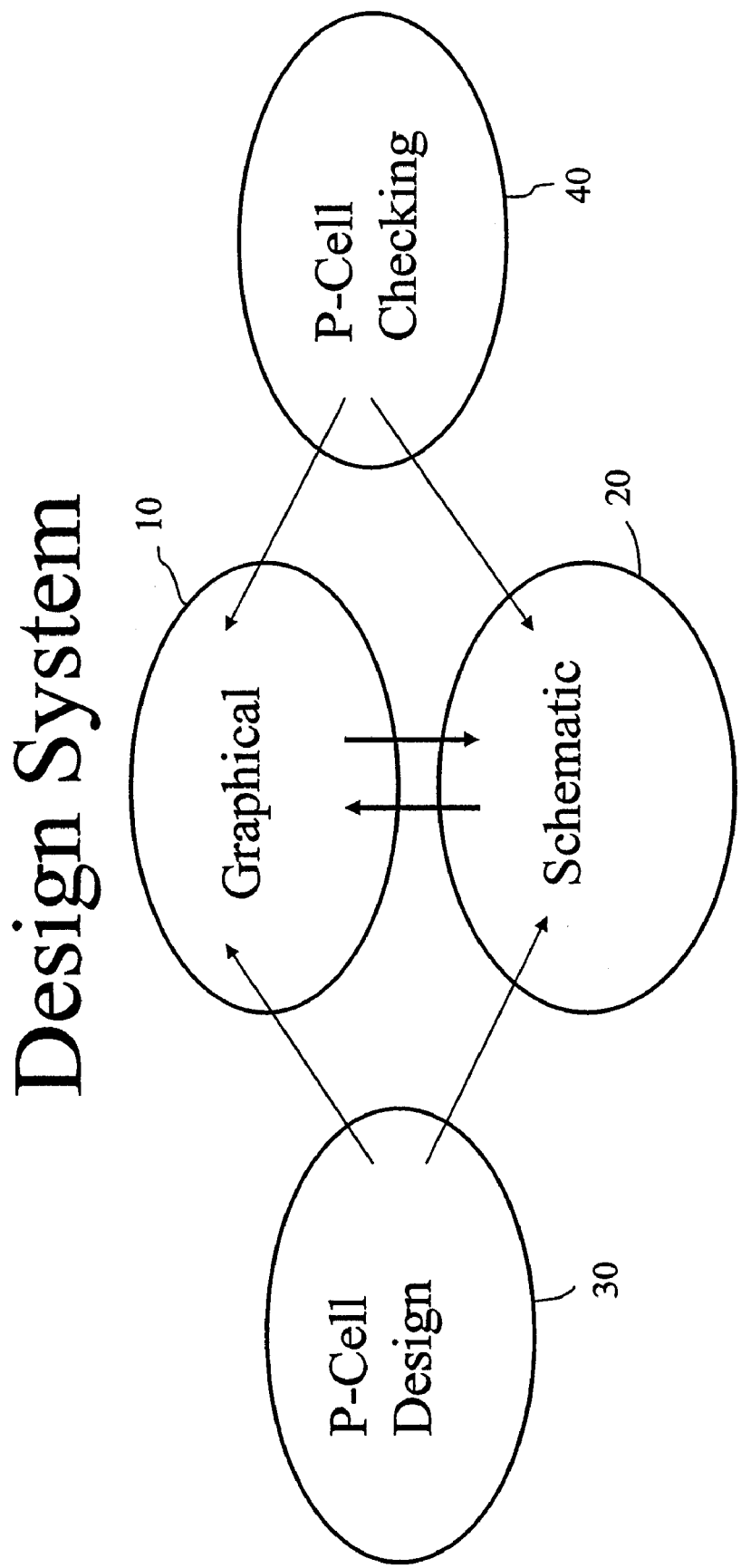
FIG. 1 shows an overview of the design system in accordance with the invention.

The design system may be embodied as a design "system" running in the CAD environment where the system allows a circuit designer to automatically design an ESD protection circuit for a chip in an expedient manner. Basically, referring to FIG. 1, the design system of the invention includes a graphical generator 10 and a schematic generator 20, interfacing to provide both schematic and graphical representations of the ESD circuit as well as the entire network. A p-cell design 30 and p-cell checking 40 may also be provided with the design of the invention.

Figure 2:
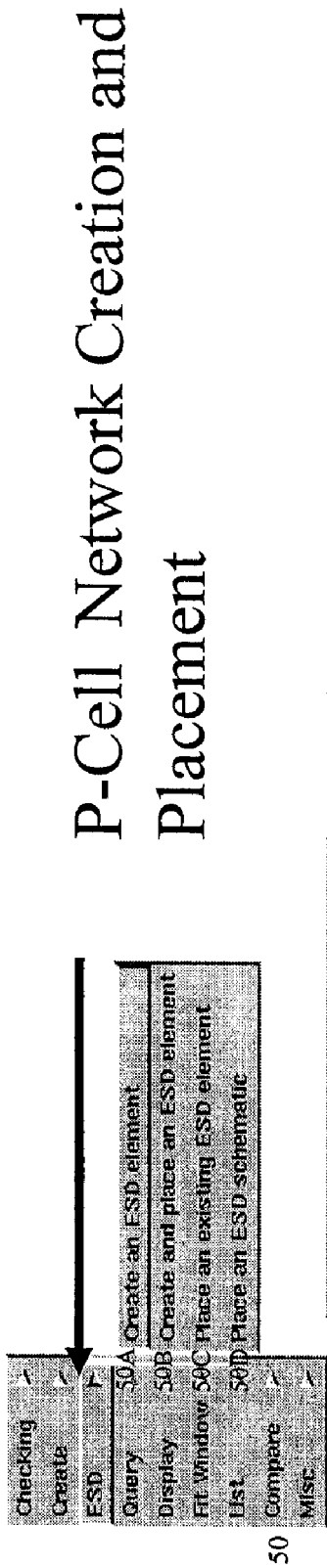
FIG. 2 represents a graphical user interface used in accordance with the invention.
Figure 2:
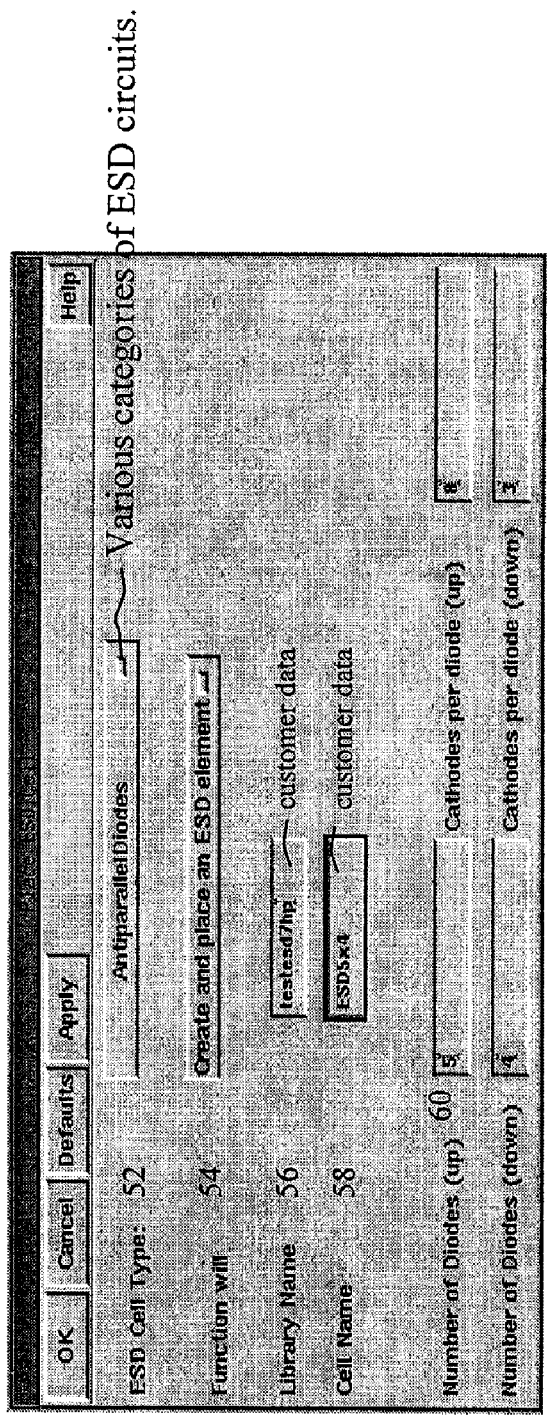

FIG. 2 represents a graphical user interface generated in accordance with the principles of the invention. The underlying concepts of the graphical user interface will be provided with reference to this figure; however, additional underlying methodologies will be discussed below. The functions associated with the graphical user interface may be implemented, for example, in a CADENCE® environment. Upon selecting the pull down menu 50, four options may be presented to the user, including:

(i) Create an ESD Element (50a)
(ii) Create and Place an ESD Element (50b)
(iii) Place an Existing Element (50c)
(iv) Place and ESD Schematic (50d)

The graphical user interface, additionally, includes an ESD cell type 52. The ESD cell type 52 may be various types of categories of ESD circuits, also known as p-cells. These circuits may include, for example, anti-parallel diodes, asymmetric anti-parallel and the like as discussed below in more detail. A function block 54 is also presented on the graphical user interface which represents one of 50a–50d. In the illustration of FIG. 2, the "create and place an ESD element" 50b has been selected by the user.

Still referring to FIG. 2, a library name 56 and cell name 58 is provided by the graphical user interface. The library and cell name may be used as a future pointer for the designer or user to obtain library information associated with the ESD cell type 52. In the illustration of FIG. 2, the library name is "testesd7hp" and the cell name is "ESD5x4". The library may also contain, for example, supersets and subsets. For one such illustration, a BiCMOS RF ESD library may contain a superset containing CMOS, Bipolar and BiCMOS ESD designs. An RF CMOS ESD library, on the other hand, may contain a subset of the BiCMOS superset. Of course, one of ordinary skill in the art would recognize that other libraries may be contemplated and implemented by the invention depending on a particular application.

FIG. 2 also allows the user the ability to input several parameters into the system of the invention, none of which are limited by that shown in FIG. 2. In the illustration of FIG. 2, these parameters, generally depicted as reference numeral 60, include number of diodes, up and down, as well as the cathodes per diode, up and down. Now, by selecting one of the four options 50a–50d and inputting the many different variables and ESD cell type, the system and method of the invention may auto-generate a ESD cell for a particular chip design, in accordance with the input variables provided by the designer.

In one implementation, the kit comprises design classes for ESD networks. In one non-limiting application, the ESD design kit hierarchy for classes of ESD networks may be as follows:

```
Category - input pad
    Sub-category - Input_RF
                 - Input_Analog
                 - Input_Digital
Category - Power Rails
    Sub-category - Diode String
                 - Antiparallel Diode Strings
                 - Asymmetric Antiparallel Strings
```

-continued

```
Category - ESD Power Clamps
    Sub-category - RC Trigger Clamps
                 - Bipolar SiGe NPN
Category - ESD Interconnect
    Sub-category - RF Circuit Connection
                   Analog Connections
                   Digital Connections
                   Power Connections
    Sub-category - Ballast Mode
                   No Ballast Mode
    Sub-category - Fill Shapes
                   Thermal Optimization Array
    Non-optimized Array
                   Unfill Shapes
```

Each category comprises a class of circuits for a particular application such as input pads, power rails and power clamps, as shown above, and each sub-category comprises members of the class.

Figure 3:
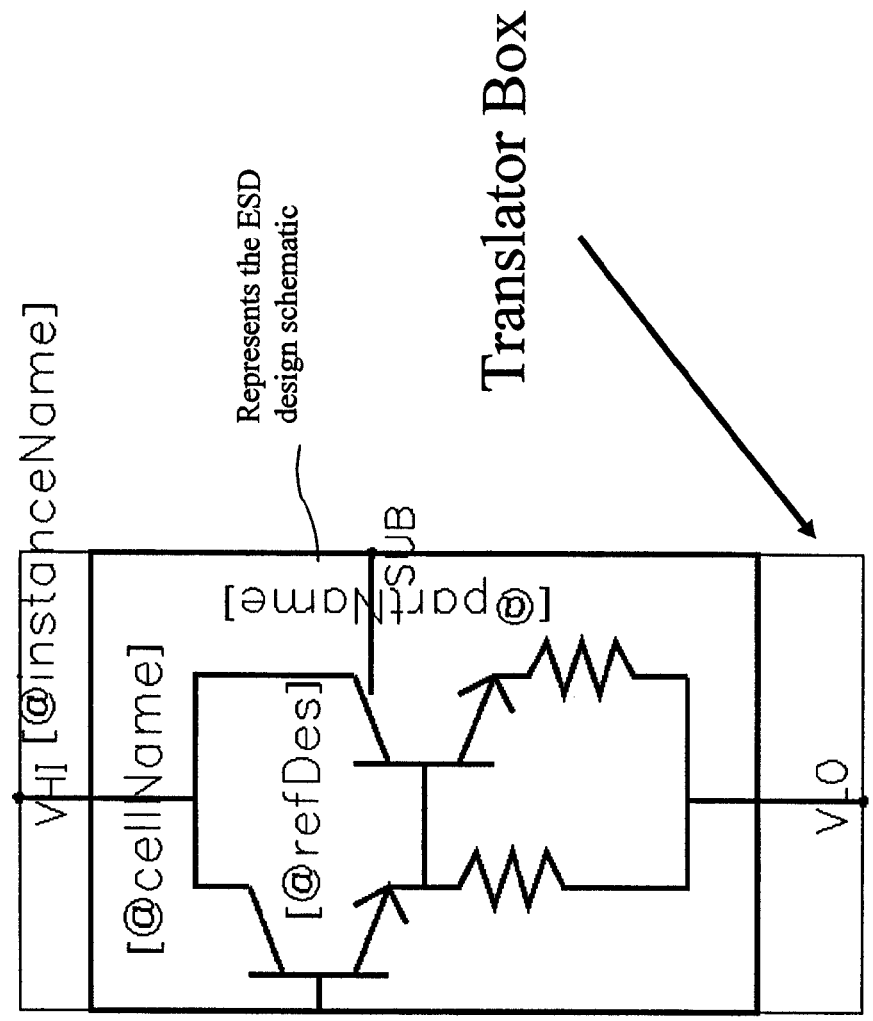
FIG. 3 shows a symbol representation of an ESD design generated in accordance with the invention.

FIG. 3 shows a symbol view of an ESD element stored in the library. The symbol representation of the ESD element includes a high voltage $V_{h\,i}$ connection and low voltage $V_{l\,o}$ connection, as well as a substrate connection sub. This symbol, as with other symbols, is auto-generated in accordance with the system and methodology of the invention.

Figure 4:
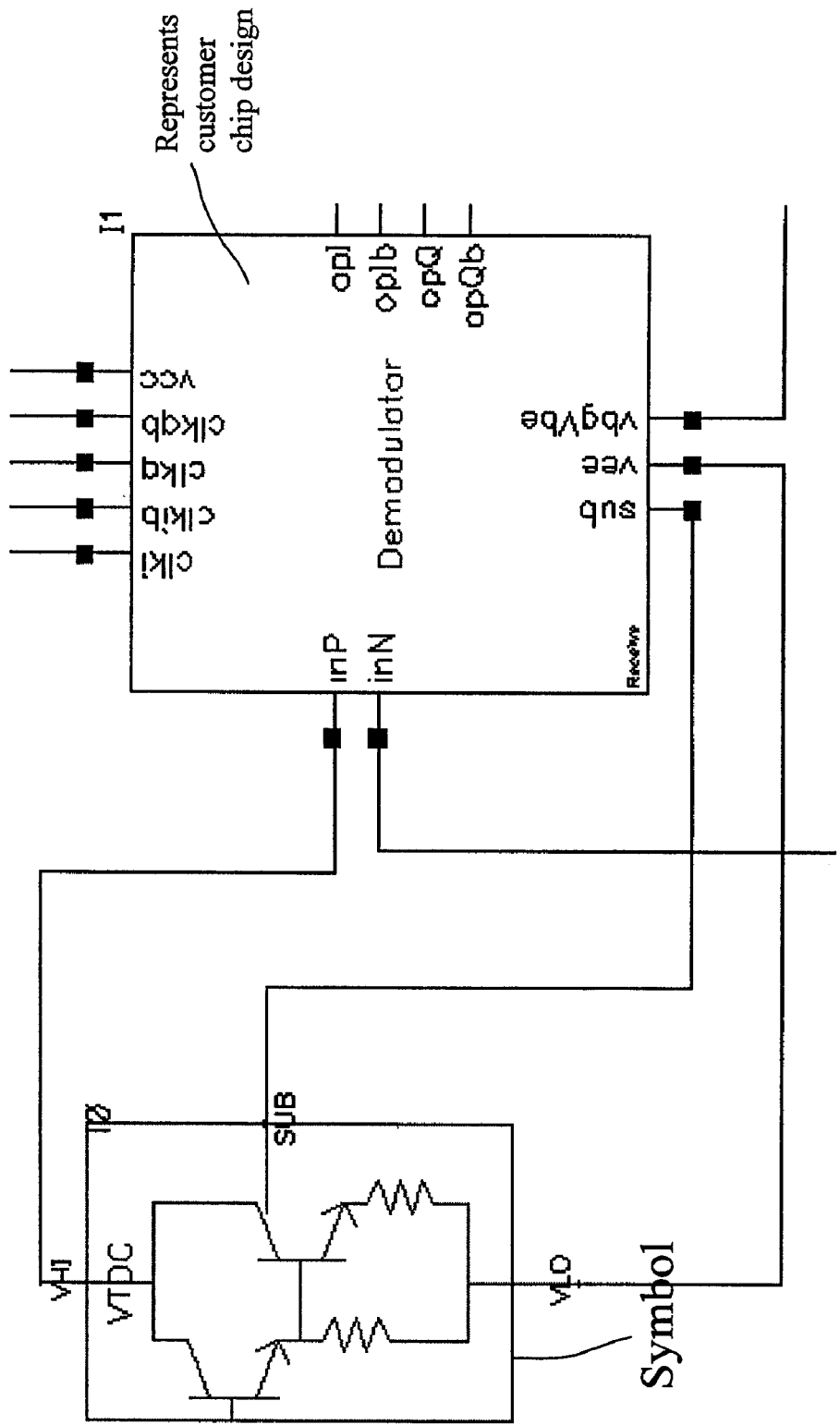
FIG. 4 shows a symbol representation of the ESD design and chip design of FIG. 3.

FIG. 4 represents the placement of the generated symbol in a schematic design of the chip circuitry for the antiparallel diode configuration, for example.

Figure 5:
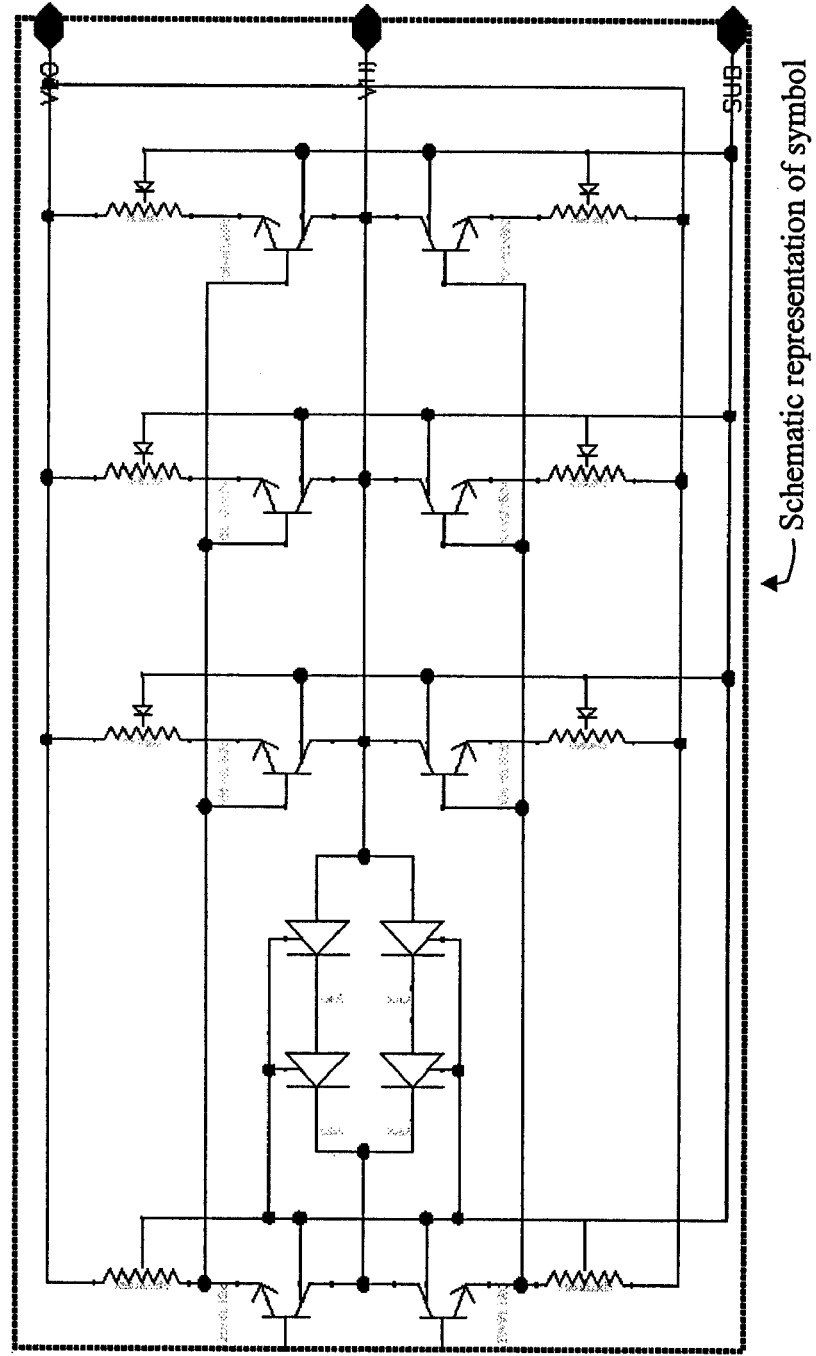
FIG. 5 represents a detailed schematic view of the symbol of an EDS element as generated in accordance with the invention.

FIG. 5 represents a detailed schematic view of the symbol of the EDS circuit. This representation again shows the high voltage $V_{h\,i}$ connection and low voltage $V_{l\,o}$ connection, as well as a substrate connection sub. As seen, in this example, two resistor, two transistor design is provided. It should be recognized, though, that other designs are equally contemplated by the present invention and that the illustrations shown herein (and hereafter) are provided for illustration of one implementation of the method and system of the invention.

Figure 6:
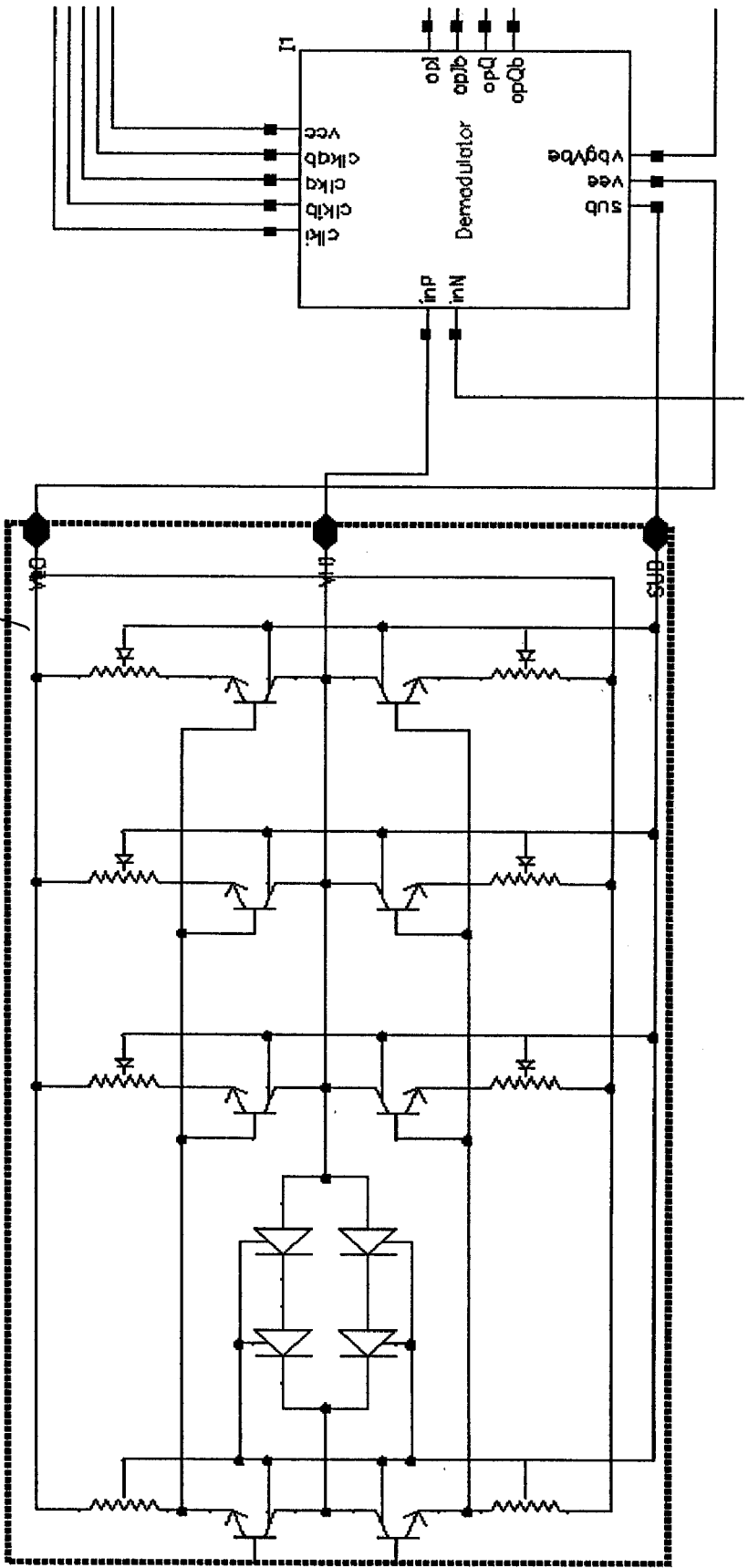
FIG. 6 represents a hierarchical representation of the placement in design schematics of the ESD element and user provided chip design generated in accordance with the invention.

FIG. 6 represents a hierarchical representation of the placement in the design schematics of the ESD circuit and user provided chip design. It should be noted that the design of FIG. 6 is a combination of the schematics of FIG. 5 implemented into the chip design shown in FIG. 4.

Figure 7:
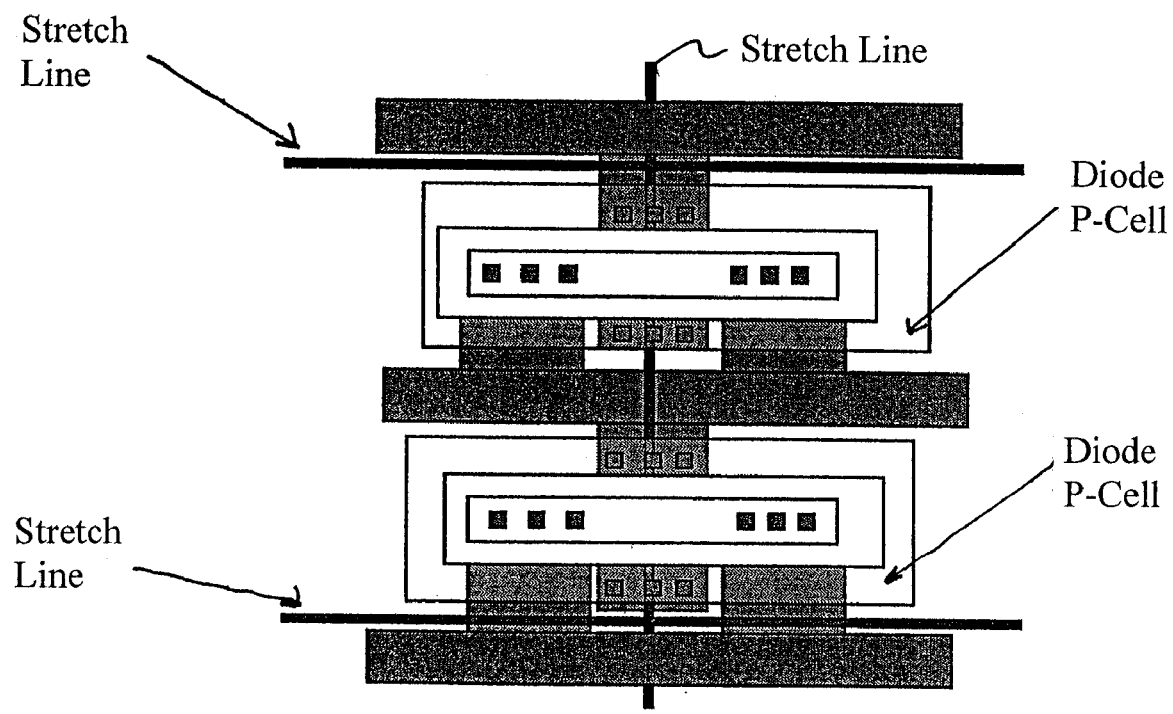
FIG. 7 shows an example of a seed element used to generate a graphical representation of the ESD element.
Figure 8:
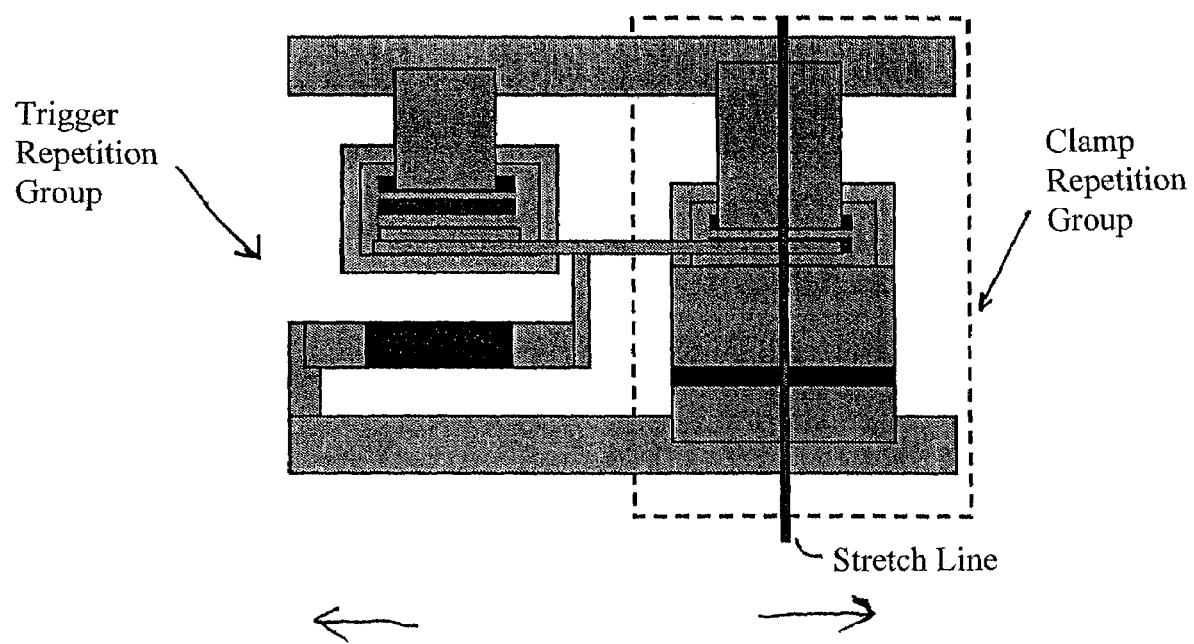
FIG. 8 shows a Hierarchical ESD Power Clamp design utilizing a grow-able ESD power clamp output device in accordance with the invention.

FIG. 7 and FIG. 8 each show examples of seed elements used to generate a graphical representation for the ESD and/or circuit design. In FIG. 7, the seed contains two grow-able p+/n-well p-cells and three stretch lines. The top stretch line has an algorithm associated with the pitch and finger number to move the $V_{oo}$ wire vertically. The lower stretch line algorithm moves the Vssbus downward as cathode fingers are added to the lower p-cell element. The vertical stretch line allows the input, $V_{DD}$, and V metal to grow with the length of the diode element.

FIG. 8 shows a hierarchical ESD power clamp design utilizing a grow-able ESD power clamp output device using repetition groups, and stretch line algorithms utilizing the "graphical methodology". From the schematic approach, a Darlington ESD power clamp network can be generated from the schematic cell view. This circuit can be represented by the full schematic in the semiconductor schematic or a facsimile symbol function.

For construction of the p-cell and the graphical representation of the circuit design, there are different methods of p-cell definition within the CADENCE® environment. This methodology is referred to as the "graphical" technique. The command structure for p-cell definition involves, for example:

(i) Stretch,
(ii) Conditional Inclusion,
(iii) Repetition,
(iv) Parameterized shapes,
(v) Repeat along shape,
(vi) Reference point,
(vii) Inherited Parameters,
(viii) Parameterized Layer,
(ix) Parameterized Label,
(x) Parameterized Property,
(xi) Parameters, and
(xii) Compile.

The Stretch function allows Stretch in X, Stretch in Y, Qualify and Modify. The Repetition function allows for Repeat in X, and Repeat in Y, Repeat in X and Y. Stretch commands require an algorithm to define the design "expression for stretch". For this p-cell, the "expression for stretch" is defined as, for example, {{pitch*num_stripes up}−pitch} where "pitch" is the width of the upward diode periodicity and the "num_stripes up" is an inherited parameter contained in the higher order p-cell passed from the lower p-cell to address the number of fingers of the diode between the input pad and the VDD power supply.

Likewise for the downward diode, a second "expression for stretch" is defined for the second p-cell diode element stretch line. The expression for stretch is defined as, for example, "{{pitch*num_stripes down}−pitch}"

for the second stretch line in the y-direction. For the first stretch line, the direction of stretch is "up" for the second stretch line, the direction of stretch is "down". For the stretch of the diode p-cells, and the busses, a stretch line exists in the x-direction. For the stretch in x, an "expression of stretch" is defined as {{a*num segments up}+b} where a and b are constants. The stretch direction is chosen to the right. One of ordinary skill in the art would recognize the output of the P-cell Parameter Summary in view of the above.

Figure 9:
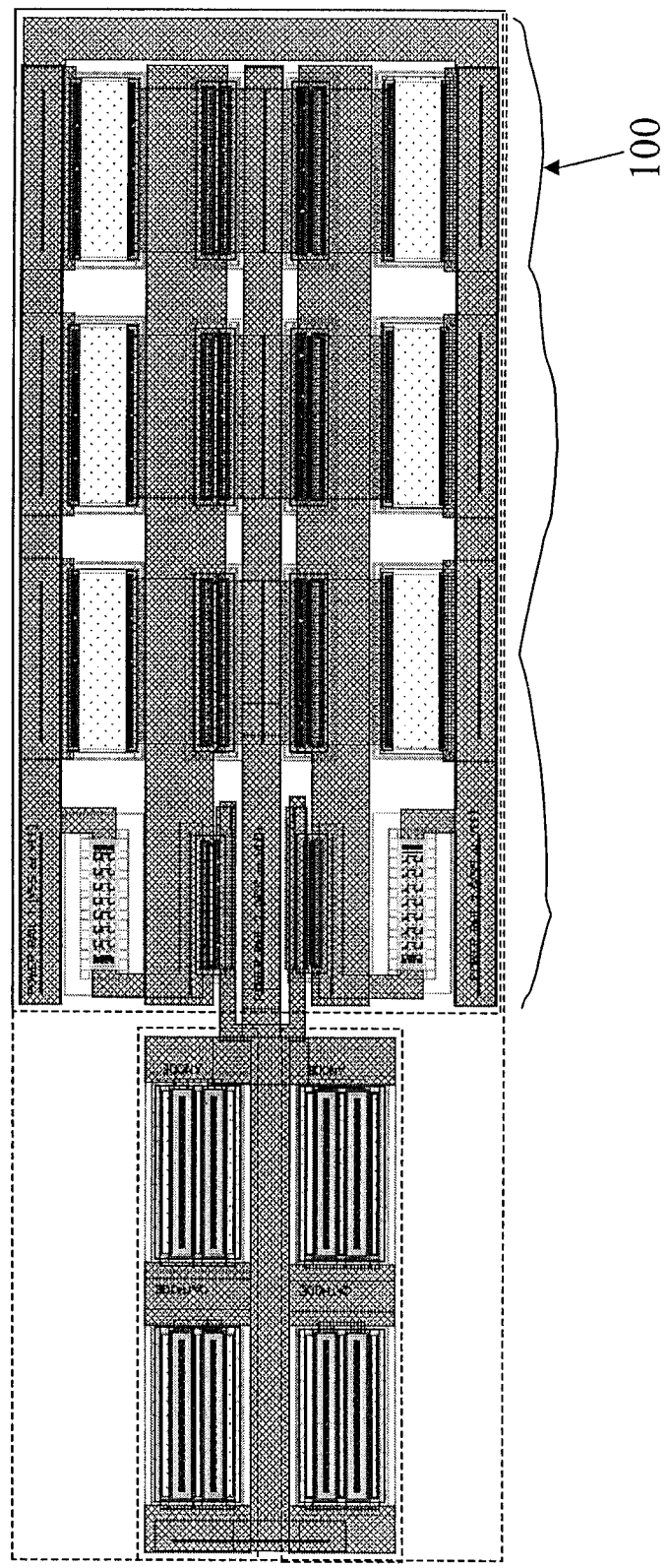
FIG. 9 shows a graphical representation of the ESD element generated in accordance with the invention.

FIG. 9 shows a graphical representation for the ESD circuit generated from the elements, for example, of FIG. 8. By way of example, FIG. 9 shows three groups 100 which may be initially seeded by the clamp repetition group of FIG. 8. The graphically representation of FIG. 9 is a final shape of the ESD circuit and is suitable for building a mask or fabrication for the chip design. The graphical representation of FIG. 9 is mathematically connected to the schematic design such that a user may switch between the schematic and the graphical representation.

Figure 10:
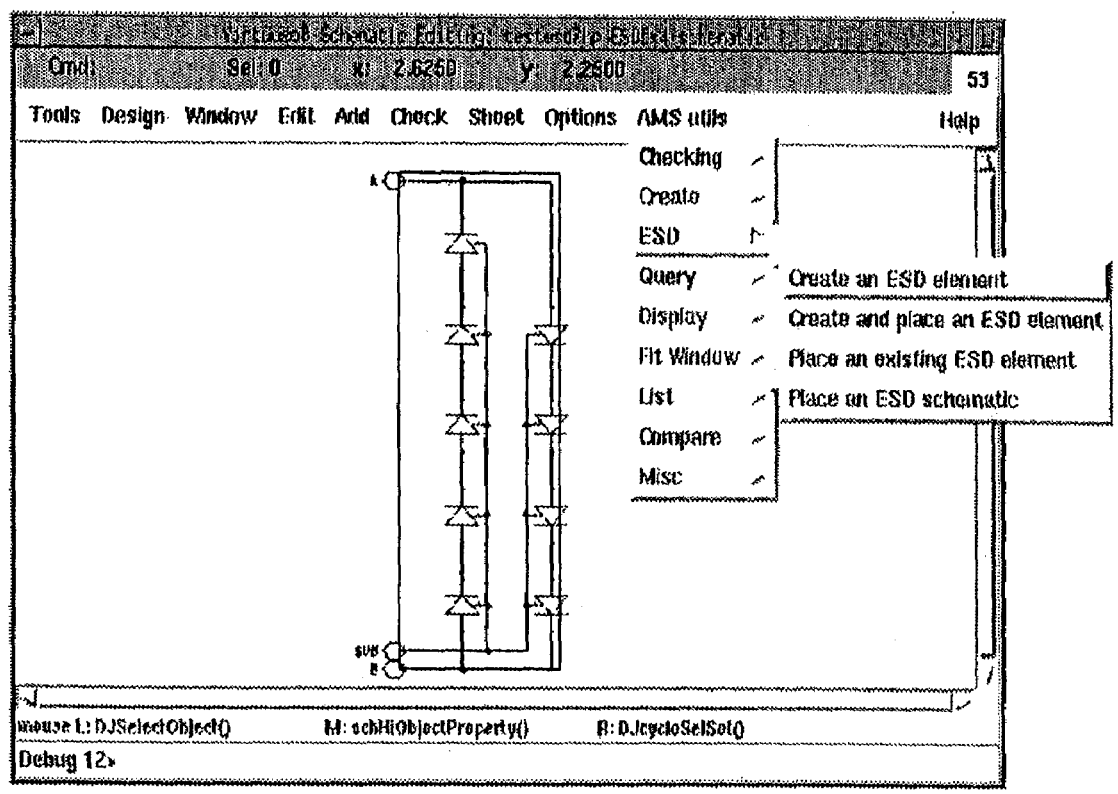
FIG. 10 shows an example of the "Create an ESD element" function initiating creation of an ESD schematic generated in accordance with the invention.

FIG. 10 shows another example of the "Create an ESD element" function initiating creation of an ESD schematic for a parameterized cell of a back-to-back diode string known as "AntiparallelDiodeString". As previously discussed, to generate the electrical schematic, the ESD design system requests the "number of diodes up" and the "number of diodes down". This determines the number of diodes in the string that are used between digital $V_{SS}$ and analog $V_{SS}$ (or RF $V_{SS}$) for grounds. For power supply rails, the "AntiparallelDiodeString" is used between digital $V_{DD}$ and analog $V_{DD}$ (or RF $V_{DD}$), for example. The design system also requests the number of cathode fingers in the diode structures for the "up" string and "down" string. In the ESD CAD design system, the schematic is generated by the input variables to account for the inherited parameters input values.

Table 1 shows an example of a structure with five diodes in one direction and a return in the opposite direction as a function of the number of cathode fingers.

TABLE 1

| SiGeC Asymmetric Diode String 5:1 Number of Cathodes | HBM Failure Voltage (V) | MM Failure Voltage (V) |
|---|---|---|
| 2 | 2300 | 240 |
| 4 | 3500 | 390 |
| 6 | 4800 | 510 |
| 8 | 6000 | 720 |
| 10 | 7200 | 750 |

A difficulty in supporting a wide range of applications is the variety power rail voltage conditions and architectures. Application types vary from Power amplifiers, VCOs, mixers, hard disk drive circuits, and test equipment. Some chips have negative voltage on the ground connections. As a result, an ESD power clamp strategy may be suitable for CMOS digital blocks, analog blocks and RF circuits with a wide variety of voltage conditions as well as negative bias on the substrate. To address this, the ESD design system has both SiGe Bipolar-based ESD power clamps and CMOS-based ESD power clamps. These ESD power clamps are designed out of parameterized cells, are growable, with flexible voltage and trigger conditions. Thus, for satisfying the CMOS digital circuitry, for example, an RC triggered MOSFET-based power clamp may be constructed out of parameterized cells. This automated hierarchical RC triggered clamp includes a NFET, PFET, and MIM (Metal Insulator Metal) capacitor p-cells.

Figure 11:
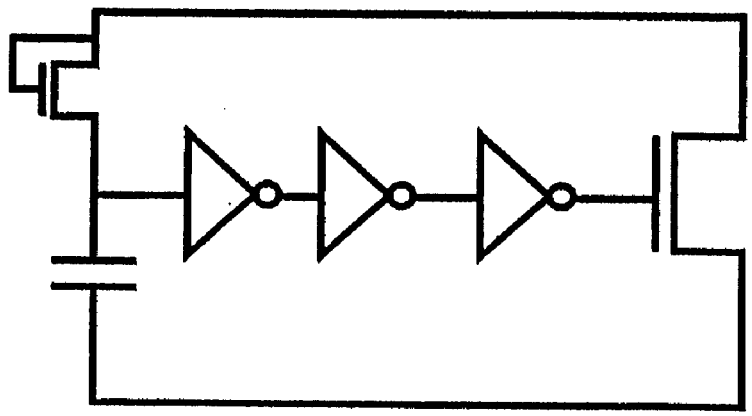
FIG. 11 shows another symbol format of an ESD element generated in accordance with the invention.

For different size digital blocks and design form factors, the size of the ESD power clamp can be physically varied, as shown in FIG. 11. In the design shown in FIG. 11, the inverter drive network is fixed with the RC-trigger network, and the output clamp element, on the other hand, are a sub-p-of the circuit. In the symbol format of FIG. 11, the RC-trigger is shown as a second-order parameterized cell where the resistor is fixed and the capacitor is variable in size. The capacitor element grows to the left. In this fashion, the RC can be tuned to a user"s chip design for optimization. The RC trigger may be then integrated with the fixed inverter network forming the third-order ptriggering network. The output clamp segment is automated to change in physical size and grows to the right. The customer has two inherited parameters which are passed up to the highest order circuit: (i) the first is the capacitor size which provides RC tuning, and (ii) the second is the size of the output clamp which provides the ESD robustness of the circuit.

Figure 12:
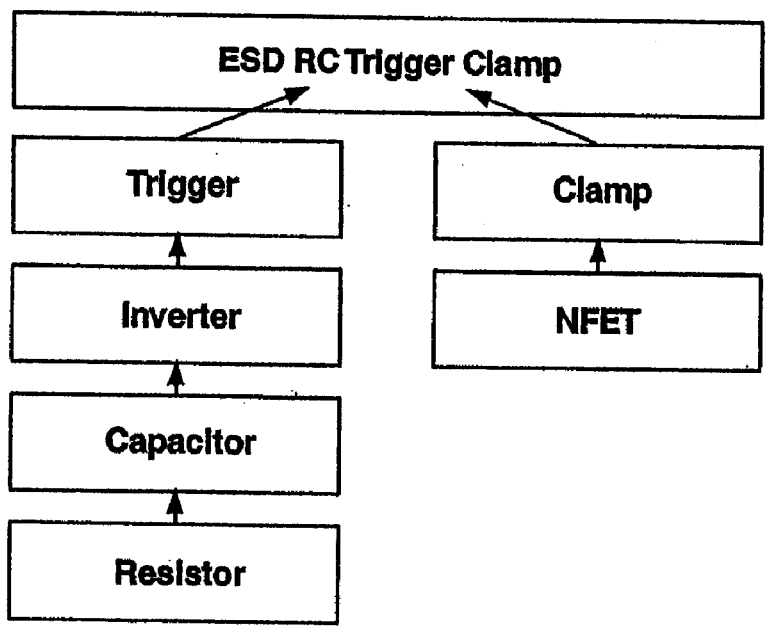
FIG. 12 is an equivalent representation of the symbol format of FIG. 12.
Figure 13:
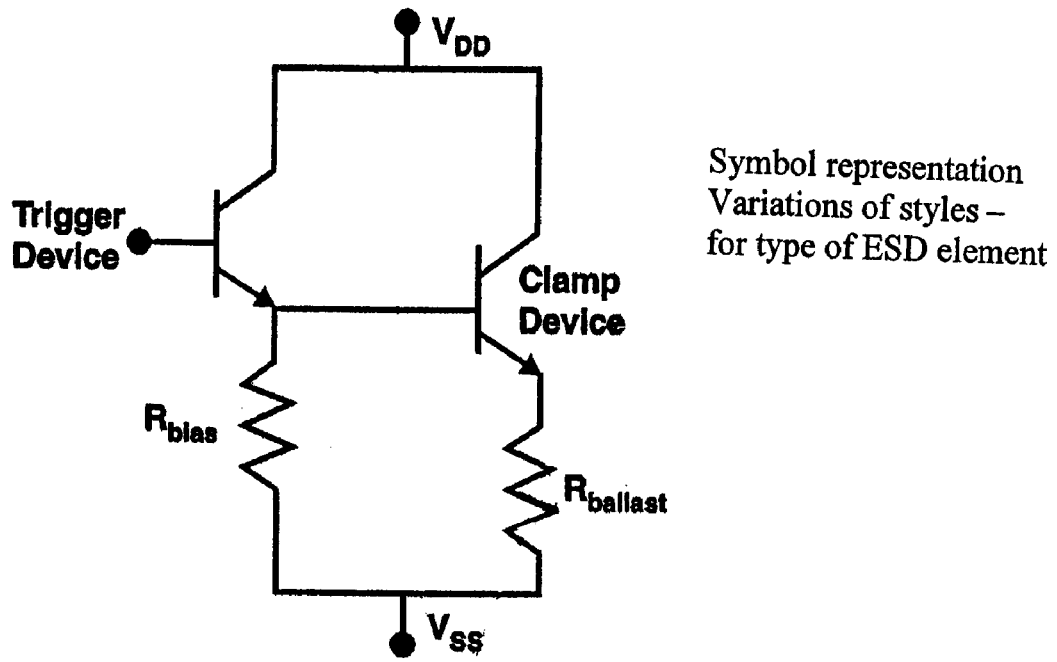
FIG. 13 shows another symbol of an ESD element generated in accordance with the invention.
Figure 14:
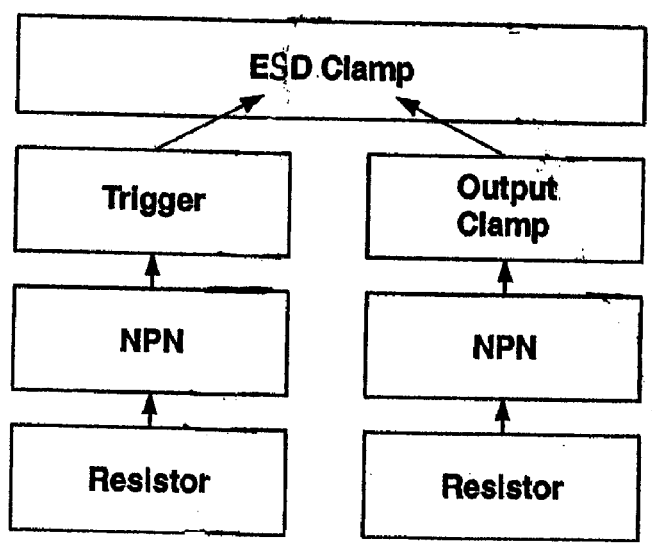
FIG. 14 is an equivalent representation of the symbol of FIG. 13.
Figure 15:
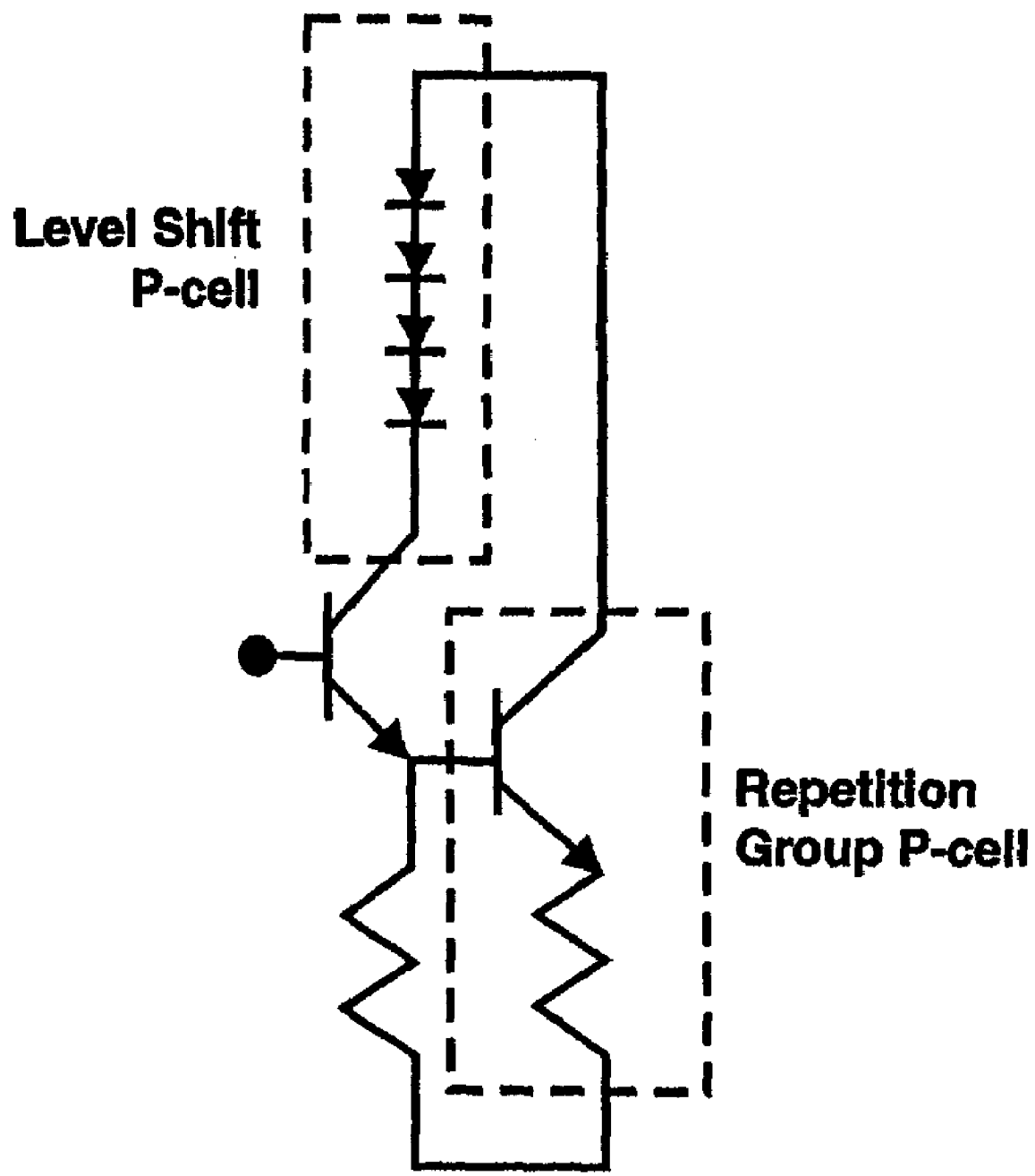
FIG. 15 shows another symbol format of an ESD element generated in accordance with the invention.
Figure 16:
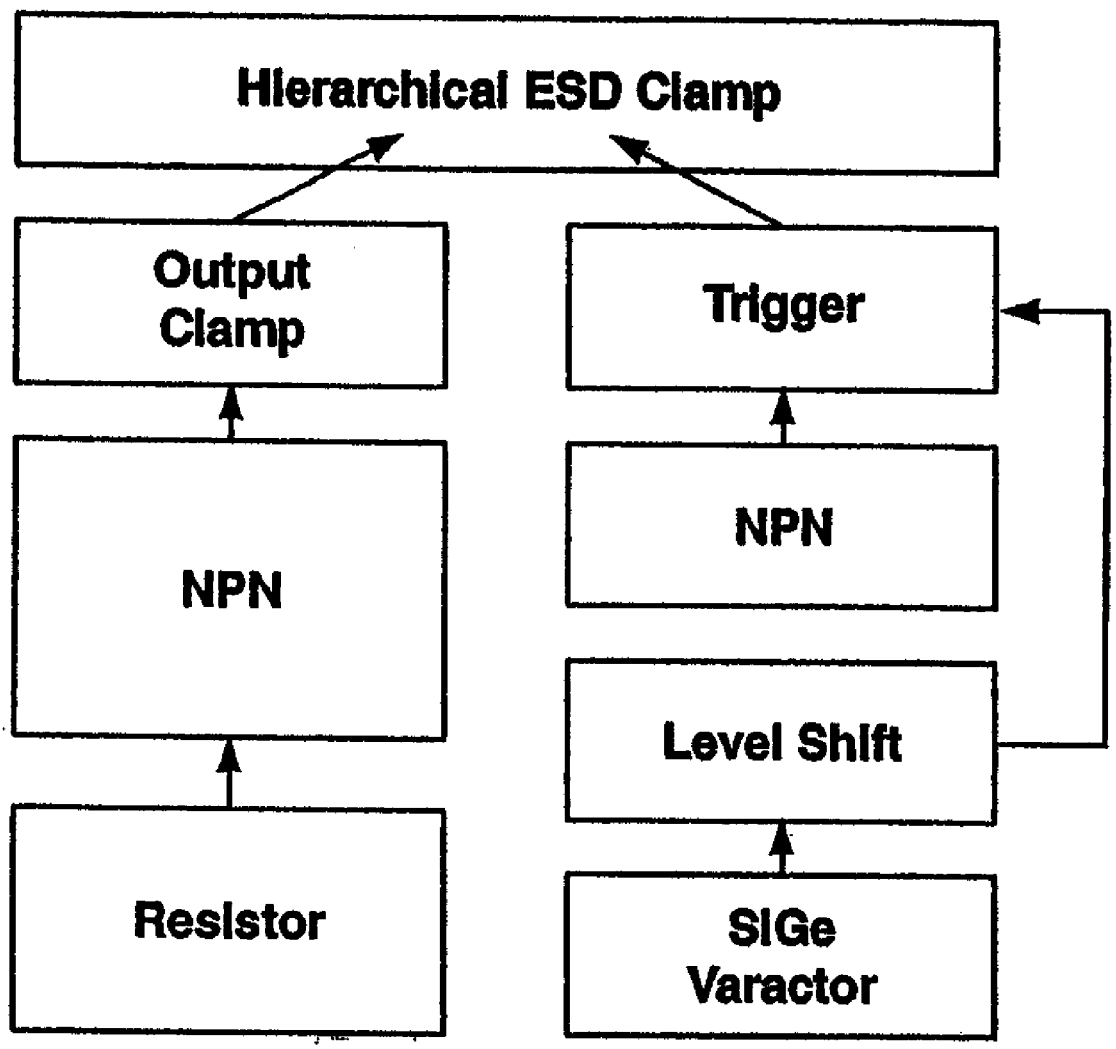
FIG. 16 is an equivalent representation of the symbol of FIG. 15.

FIG. 12 is an equivalent representation of the symbol format of FIG. 11. FIGS. 13 and 14 are symbol generated and hierarchical representations, respectively, of various styles for ESD elements. Likewise, FIGS. 15 and 16 are symbol generated and hierarchical representations, respectively, of various styles for ESD elements.

In one example, again, for the BiCMOS analog and RF functional blocks, automated hierarchical ESD power clamps are designed to allow for different voltage trigger conditions and the size of the power clamp. A first ESD power clamp circuit has a fixed trigger voltage based on the $BV_{CEO}$ of the trigger transistor, and the output device is a low $f_t$ device with a high $BV_{CEO}$ SiGe HBT npn device. This network is suitable for BiCMOS chips, bipolar-only implementations, and suitable for both zero potential and negative biased substrates. In the design kit, both high-voltage and low-voltage triggers can be used.

ESD experimental studies may be generated in test sites by "creating instances" of the ESD power clamps varying the inherited parameters. Table 2 shows an example of the power clamp as the "number of clamps" is increased at the output with a fixed trigger element. ESD results improved with the structure size, in particular, Table 2 shows Hierarchical Parameterized Cell ESD Power Clamp ESD results with a 120 GHz/100 GHz $f_t/f_{MAX}$ Silicon Germanium HBT with Carbon incorporation. Excellent Human Body Model (HBM), Machine Model (MM) and Transmission Line Pulse (TLP) testing results are achieved in this ESD power clamp instance.

TABLE 2

| Power Clamp Emitter Length (m) | HBM Failure Voltage (V) | MM Failure Voltage (V) | TLP Failure Current (A) |
| --- | --- | --- | --- |
| 50 | 2500 | 240 | 0.7 |
| 100 | 3100 | 390 | 1.25 |
| 150 | 4700 | 480 | 1.7 |
| 200 | 5000 | 600 | 1.8 |
| 250 | 5900 | 630 | 2.1 |

To address the different power supply conditions, a level-shifting parameterized sub-design p-cell may be created. The second ESD power clamp includes a level shifting p-cell, a trigger SiGe transistor, a bias resistor p-cell, and the repetition group of the clamp output and resistor ballast elements. This design has two automation variables:

(i) first the trigger condition allows growing of a string of series SiGe varactors to increase the trigger condition and (ii) second, the output clamp and ballast resistor can be increased based on the design area, and desired ESD protection level. All interconnects are grow-able to allow the diode string and clamp size to increase in size automatically. From the schematic methodology, the personalization of the ESD power clamp can be first initiated as a circuit, and then as graphical layout.

Figure 17:
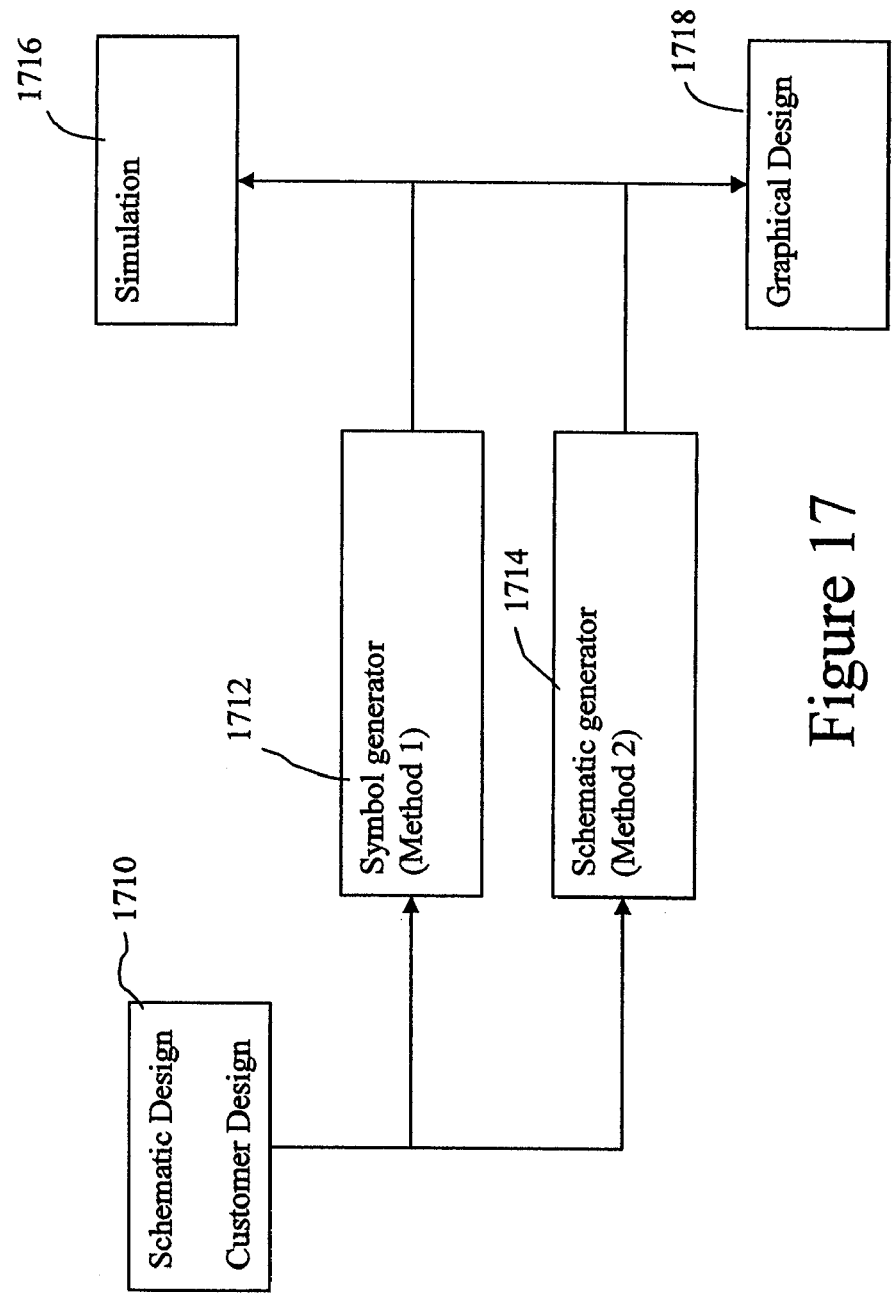
FIG. 17 is a flowchart showing the overall steps of the invention.

FIG. 17 is a flow chart showing the overall steps of the invention. The flow of FIG. 17 (and remaining flows of the invention) may equally represent a high level block diagram of the invention. The steps of FIG. 17 (and other flows of the invention) may be implemented on computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). Additionally, the computer program code can be transferred to a workstation over the Internet or some other type of network.

Referring now to FIG. 17, in step 1710, the user provides a schematic design. This may be provided by inputting the design variables into the interface of FIG. 2. The system of the invention may then perform a symbol generation at step 1712 or a schematic generation at step 1714. The symbol generation step 1712 may include the selection of options 50a–50c of FIG. 2. On the other hand, the schematic generation may include the selection of option of 50d of FIG. 2. A simulation may then be performed at step 1716. A graphical design representation may be provided at step 1718, in accordance with the above discussion.

Figure 18:
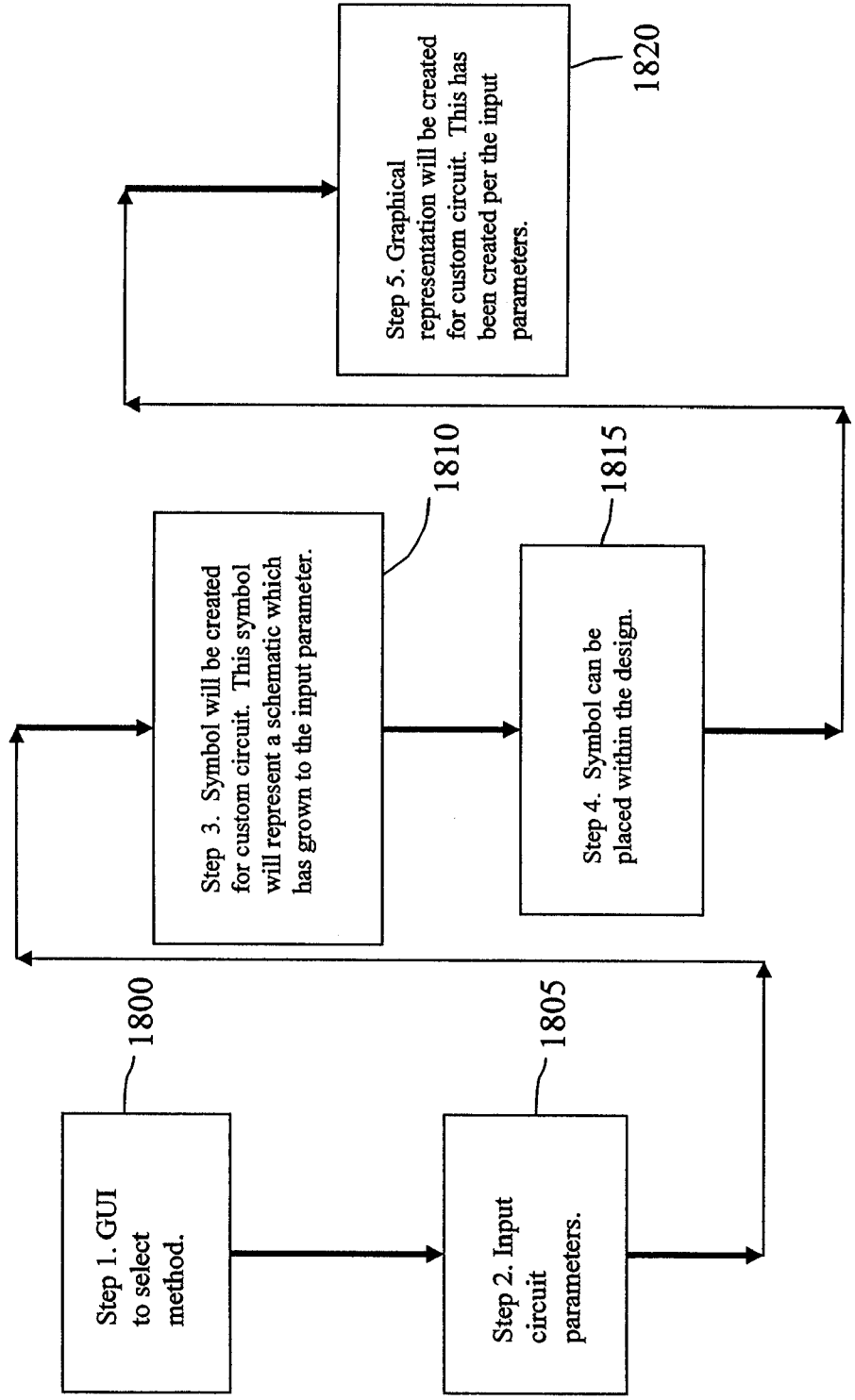
FIG. 18 is a flowchart of a more detailed implementation of in accordance with an aspect of the invention.

FIG. 18 is a more detailed implementation of the invention. At step 1800, the user will select a function according to the pull down menu 50 of FIG. 2. At step 1805, the user inputs the circuit parameters. At step 1810, a symbol will be created for the custom circuit using the basic p-cells as building blocks to form the high level ESD circuit meeting the specified parameters. As in the case of the lower level p-cells, various parameters that define the high level ESD circuit itself are fixed while others of the parameters are "grow-able" depending on the parameters and conditions specified by the user. This symbol will then be represented as a schematic which has grown to the input parameters. At step 1815, the symbol can be placed in the design, similar to the representation of FIG. 4. At step 1820, the graphical representation will be created for the custom circuit based on the seed element as shown, for example, in FIG. 8. The output graphical representation is illustrated as one example in FIG. 10.

Figure 19:
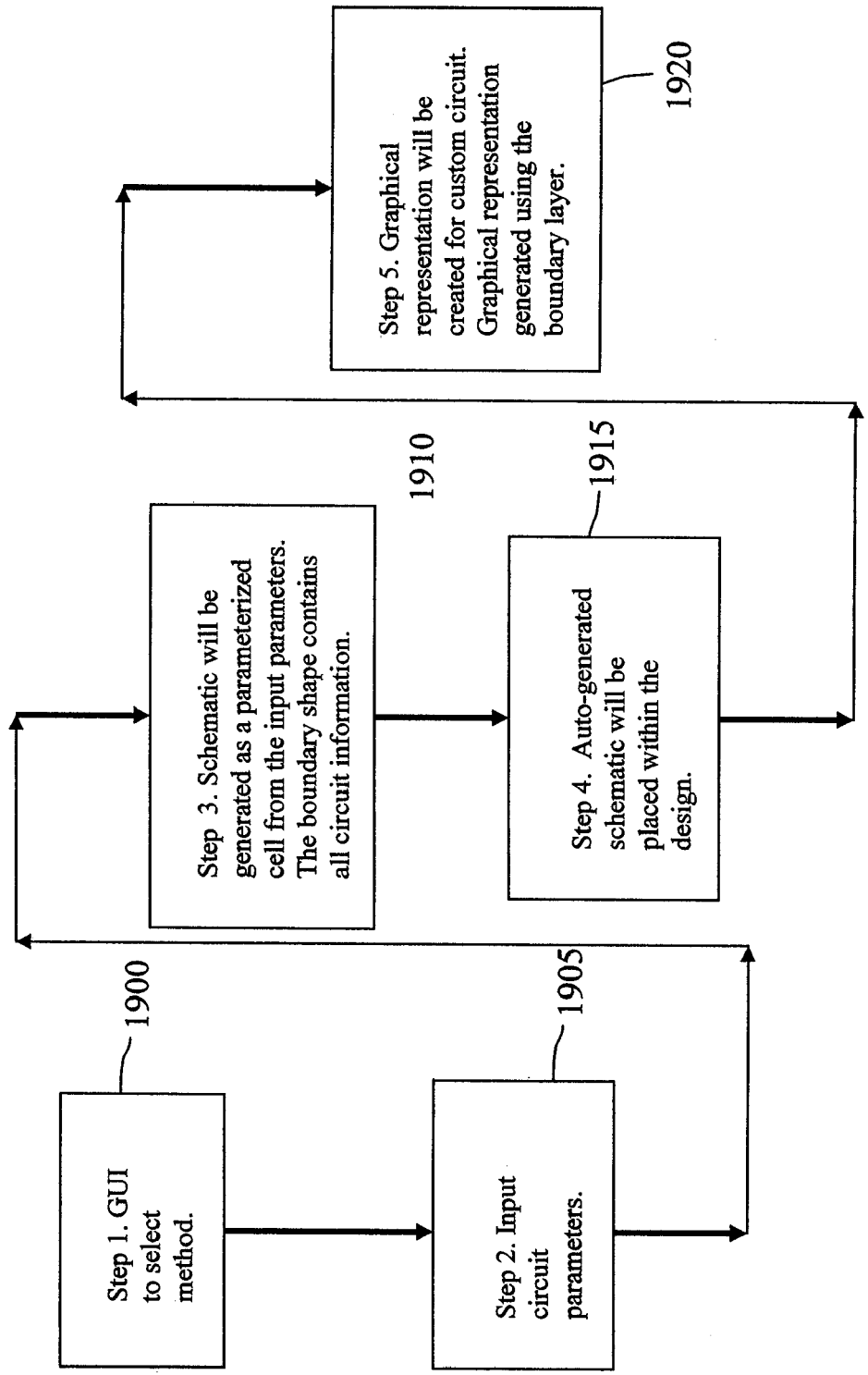
FIG. 19 is flowchart of a more detailed implementation of an aspect of the invention.

As shown in FIG. 19, at step 1900 a GUI method is selected. The schematic will be generated as a parameterized cell from the input parameters at step 1910. The boundary shape of the cell will contain the circuit information. At step 1915, the system and method will autogenerate the schematic and will be placed within the design. This is represented in FIG. 6, for example. At step 1920, the graphical representation will be created for the custom circuit, which has been created per the input parameters. In one implementation, the graphical representation may be formed using a "static p-cell substantiation translator box" formed around the circuit schematic representation providing definition, as well as containing all the inherited or variable input parameters of the contained circuit. This "static p-cell substantiation translator box" also serves in the mapping process which will be discussed. This process is necessary to provide a "flattening" of the hierarchy to avoid sub-circuit redefinition problems.

Figure 20:
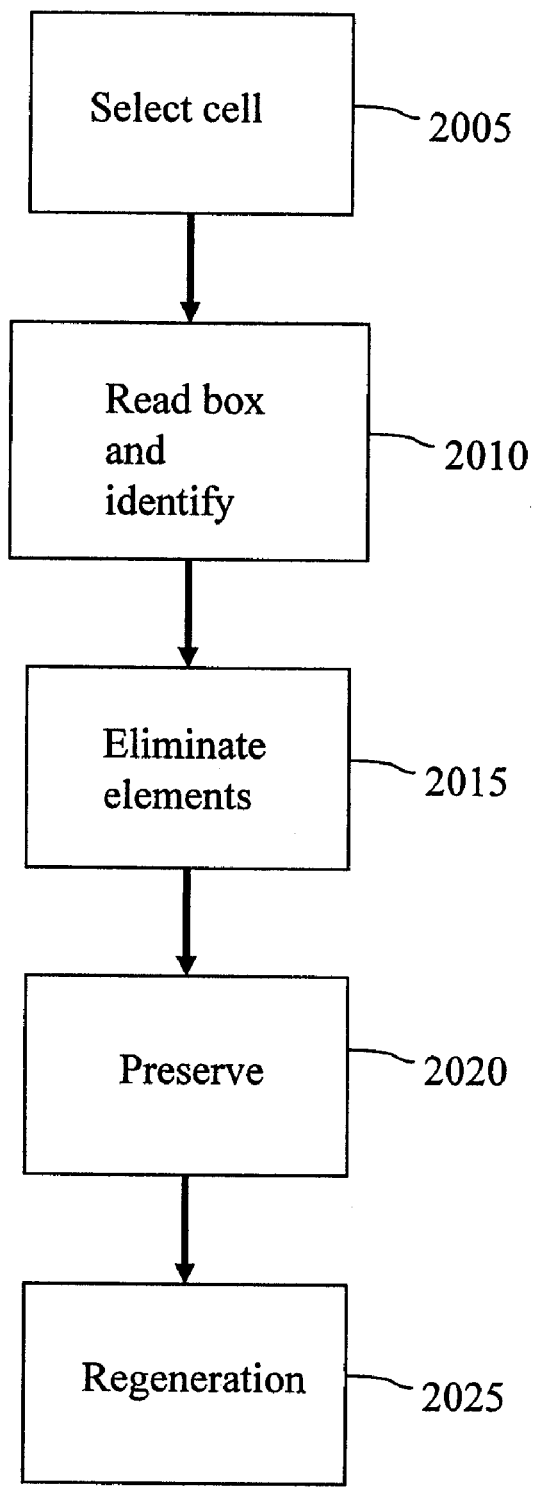
FIG. 20 shows a flowchart representing the mapping of an "intrinsic higher order p-cell" circuit into a graphical layout representation in accordance with the invention.

A second method may be required for the mapping of an "intrinsic higher order p-cell" circuit into a graphical layout representation. Using standard processes and methods, this can not be resolved due to the complexity of the mapping process. In this case, a methodology is needed to provide this functionality. This method involves the following steps as shown in the flow of FIG. 20. First, at step 2005, the intrinsic p-cell is selected. At step 2010, the "static p-cell substantiation translator box" is read and identifies which components is part of the higher order p-cell circuit. At step 2015, all elements inside the static p-cell substantiation translator box are eliminated. The inherited parameters and all information are preserved at step 2020. Then at step 2025, re-generation of all new graphical information from the static p-cell substantiation translator box and a graphical p-cell representation is formed inside this box structure.

During Schematic Circuit Design, the procedure described is invoked which will input the characteristics of an ESD protection circuit and either:

1. Generate a symbol representing the circuit using the input parameters. The procedure will auto-generate the artwork and create a static schematic representation of the circuit by wiring the individual components using the input parameters. This circuitry is grouped by the symbol. The input parameters describing the circuit characteristics are associated with the symbol. The procedure uses the mechanism which auto-generates a schematic; namely, creates a hierarchical parameterized schematic with the translation box. This is then stored as a separate cell, not integrated into the designed cell. A symbol representing this circuitry is created and that element is placed in the circuitry representing the schematic; or 2. Generate a hierarchical schematic using a procedure to generate a variable schematic based on the input parameters. The schematic will auto-generate the individual components and wiring. The input information describing the circuit characteristics are associated with the translator box drawn enclosing the generated schematic circuitry. This procedure will accept from the designer input parameters (such as number of stages, number of components, power source, protection capability) and from that information generate a schematic design based on characterized circuit structures. The procedure is a Parameterized Cell (as discussed throughout) which accepts the inputs and instantiates components (such as resistors, MOSFETs, varactors, BJTs (Bipolar Junction Transistor), diodes) and auto-wires them to create the ESD circuit.

After generation of a schematic/symbol representation of the described circuit, the components now placed and wired may be simulated through a Spice type simulator using the primitive models. It should be known to those of skill in the art that a Spice type simulator is a circuit simulation tool. Other tools which may be used are, for example, Spectre or HSpice (but any circuit simulator can be supported by the invention). Thus, as should now be understood, the hierarchical schematic can be simulated using the component primitives and a larger subcircuit model need not be generated because it is built hierarchically. The circuitry may be generated into a physical representation by grouping the individual circuit elements by reading the translator box and removing the individual components and replacing these elements with a hierarchical physical representation of the described circuitry.

ESD Interconnect Checking and Verification

Figure 21:
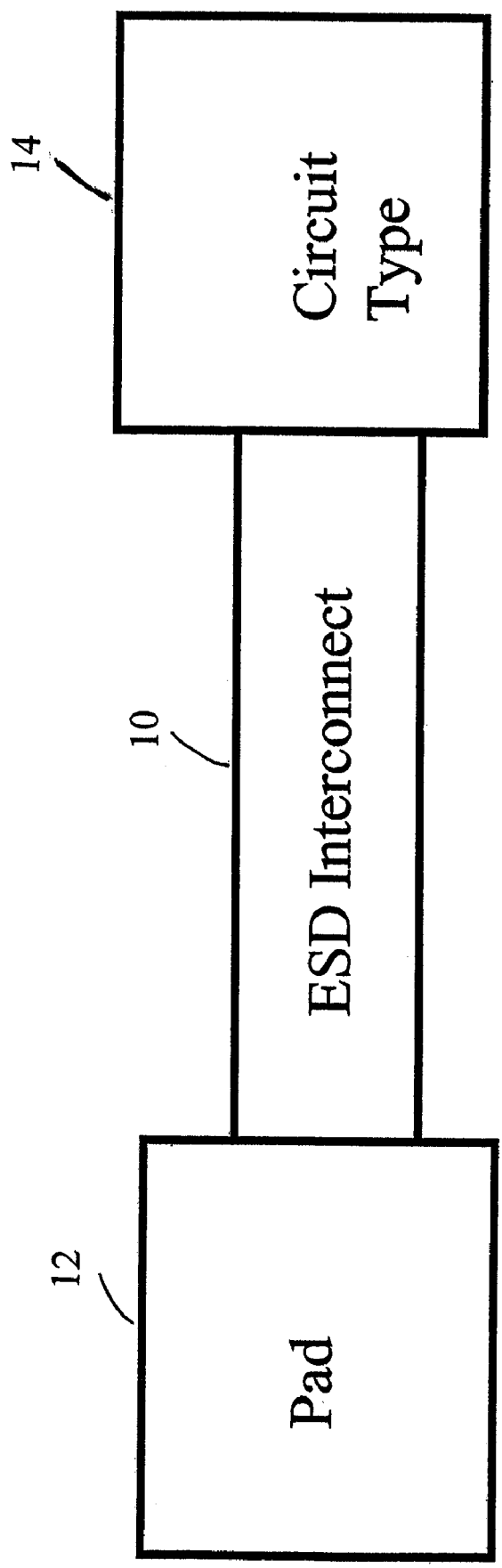
FIG. 21 shows a representation of an ESD Interconnect in accordance with the invention.

The invention also provides an ESD interconnect solution, referred to as "ESD Interconnect". As shown in FIG. 21, the ESD Interconnect is an interconnect which is a custom parameterized cell that is connected between an input pad and parameterized cell ESD networks. More specifically, the ESD Interconnect includes a parameterized cell 10 which can connect from an input pad 12 on any design level to the hierarchical parameterized cell ESD network 14. The "ESD Interconnect" will be a hierarchical parameterized cell which may provide the following:

1. Verify the connection between the pad and the ESD network by verifying and checking electrical connectivity (See, FIGS. 22–24).

2. Verify the width requirements to maintain ESD robustness to a minimum level.

3. Verify that based on the ESD robustness of the ESD network that the interconnect width and via number is such to avoid electrical interconnect failure prior to the ESD network failure.

4. Allow for multiple lines in parallel whose cross section can be maintained and evaluated as a set of parallel interconnect connected to a single ESD network or plurality of ESD networks.

Figure 25:
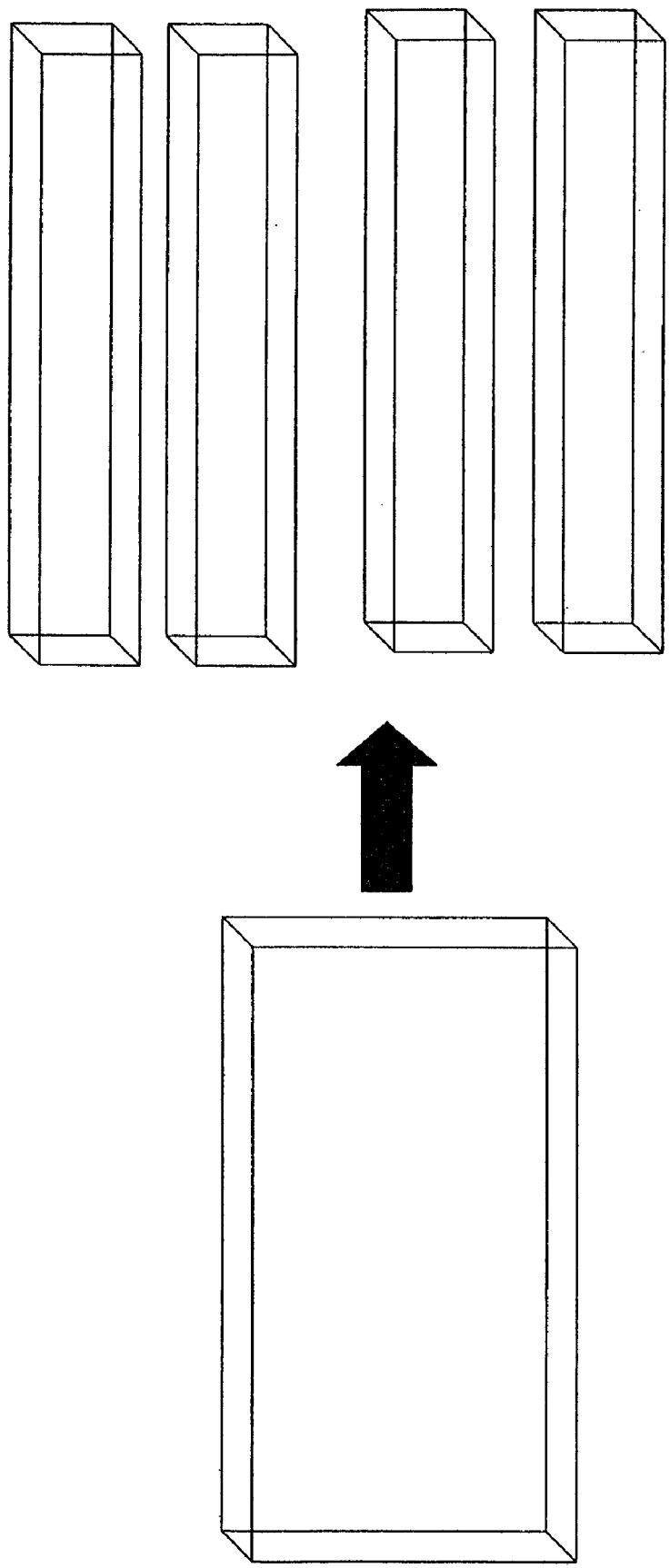
FIG. 25 shows a representation of ESD ballasting to provide current uniformity in accordance with the invention.

5. Allow for "ESD ballasting" by dividing into a plurality of lines. (See, FIG. 25.)

6. Allow for calculation of the ESD robustness of the interconnect based on pulse width, surrounding insulator materials (e.g., $SiO_2$ or low K materials), metal level and distance from the substrate (thermal resistance based on the metal level or underlying structures.

7. Account for surrounding fill shapes.

Figure 26:
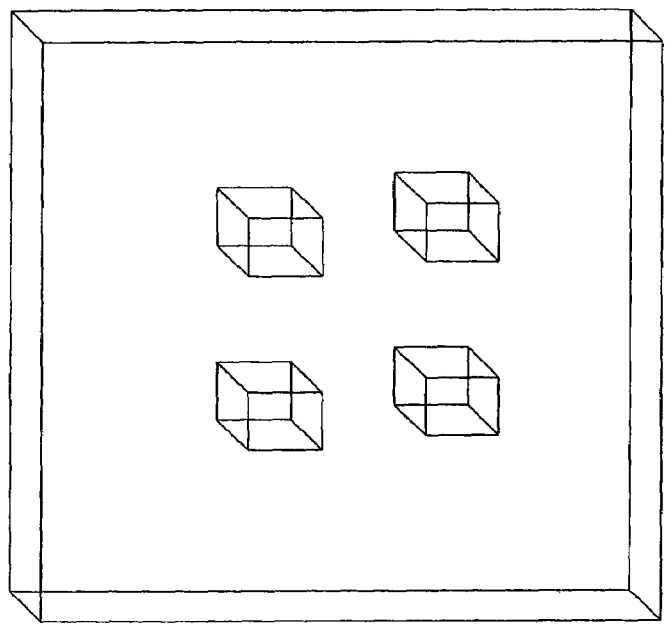
FIG. 26 shows a representation of a cheesing feature for improved ESD robustness in accordance with the invention.

8. Account and adjust for "cheesing" (removal of interconnect material inside the interconnect) of the interconnect. (See, FIG. 26.)

Figure 22:
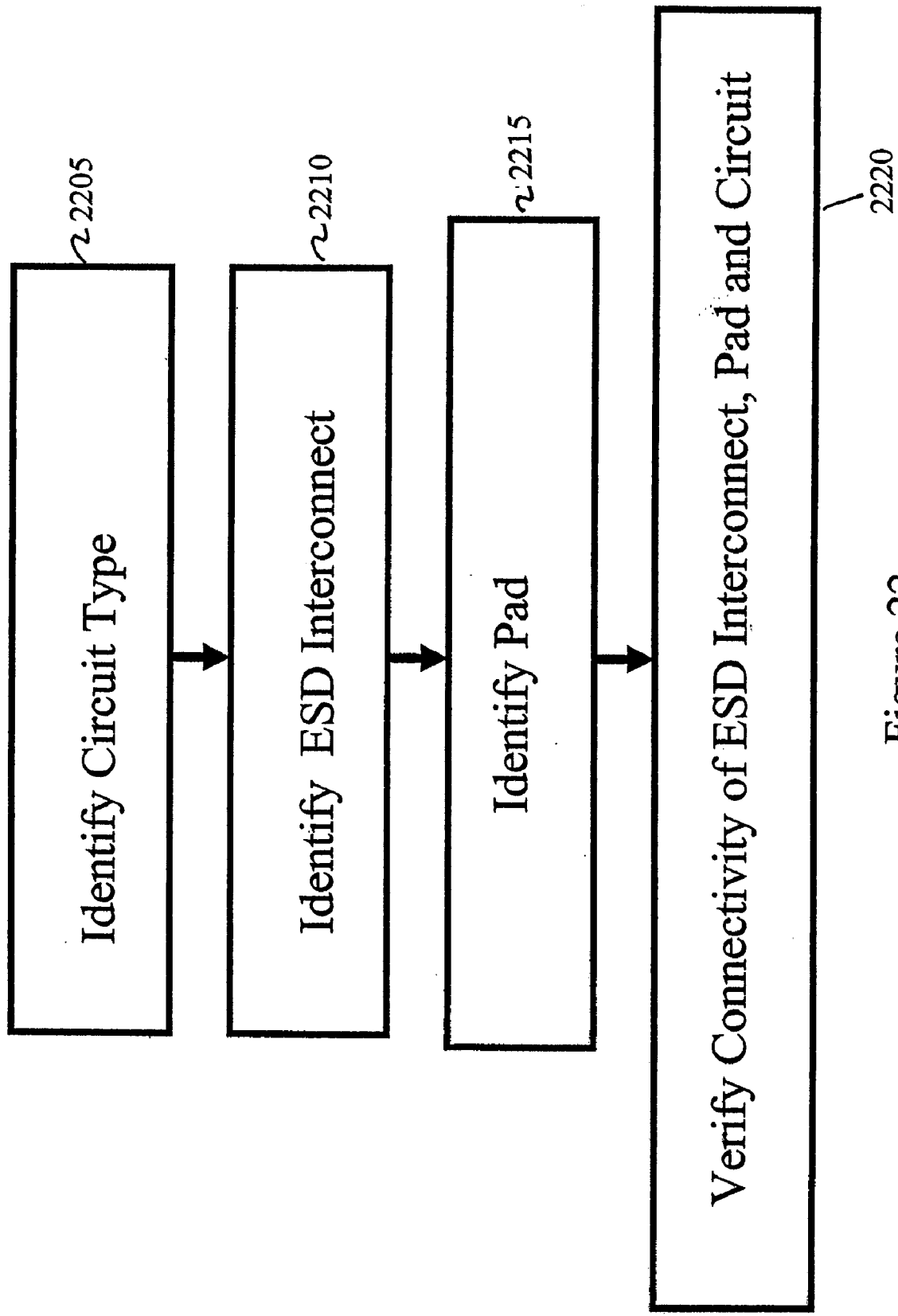
FIGS. 22–24 show flowcharts implementing the verification of interconnectivity of various elements in accordance with the invention.

By way of one implementation, in FIG. 22, a flow is provided for verifying the connectivity of the ESD Interconnect, pad and circuit. In the implementation of FIG. 22, at step 2205, the flow identifies the circuit type. At step 2210, the flow identifies the ESD interconnect. At step 2215, the flow identifies the pad. At step 2220, the flow verifies that there is a connection of the ESD Interconnect, the pad and the circuit.

Figure 23:
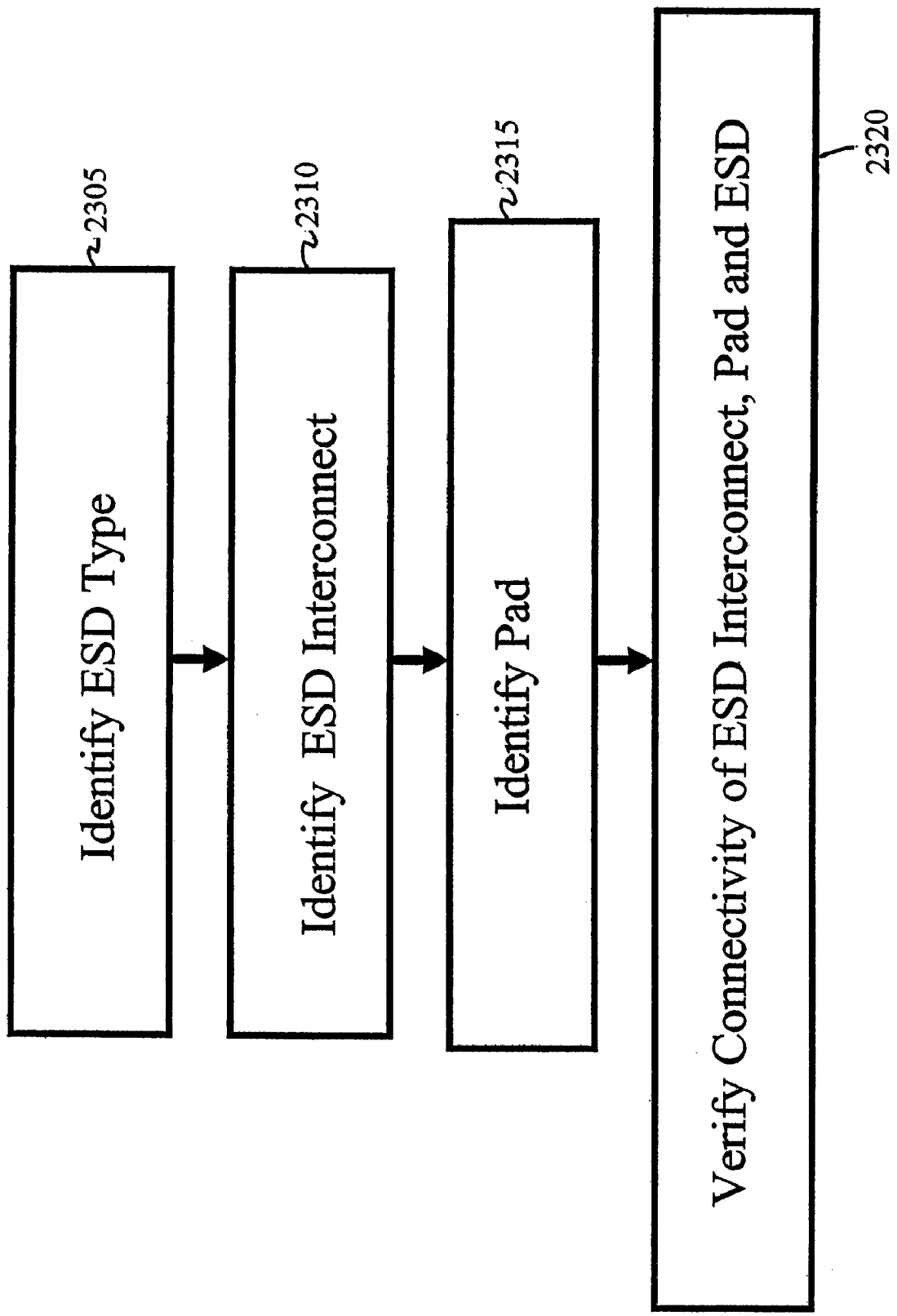

In the implementation of FIG. 23, at step 2305, the flow identifies the ESD type. At step 2310, the flow identifies the ESD interconnect. At step 2315, the flow identifies the pad. At step 2320, the flow verifies that there is a connection of the ESD Interconnect, the pad and the ESD.

Figure 24:
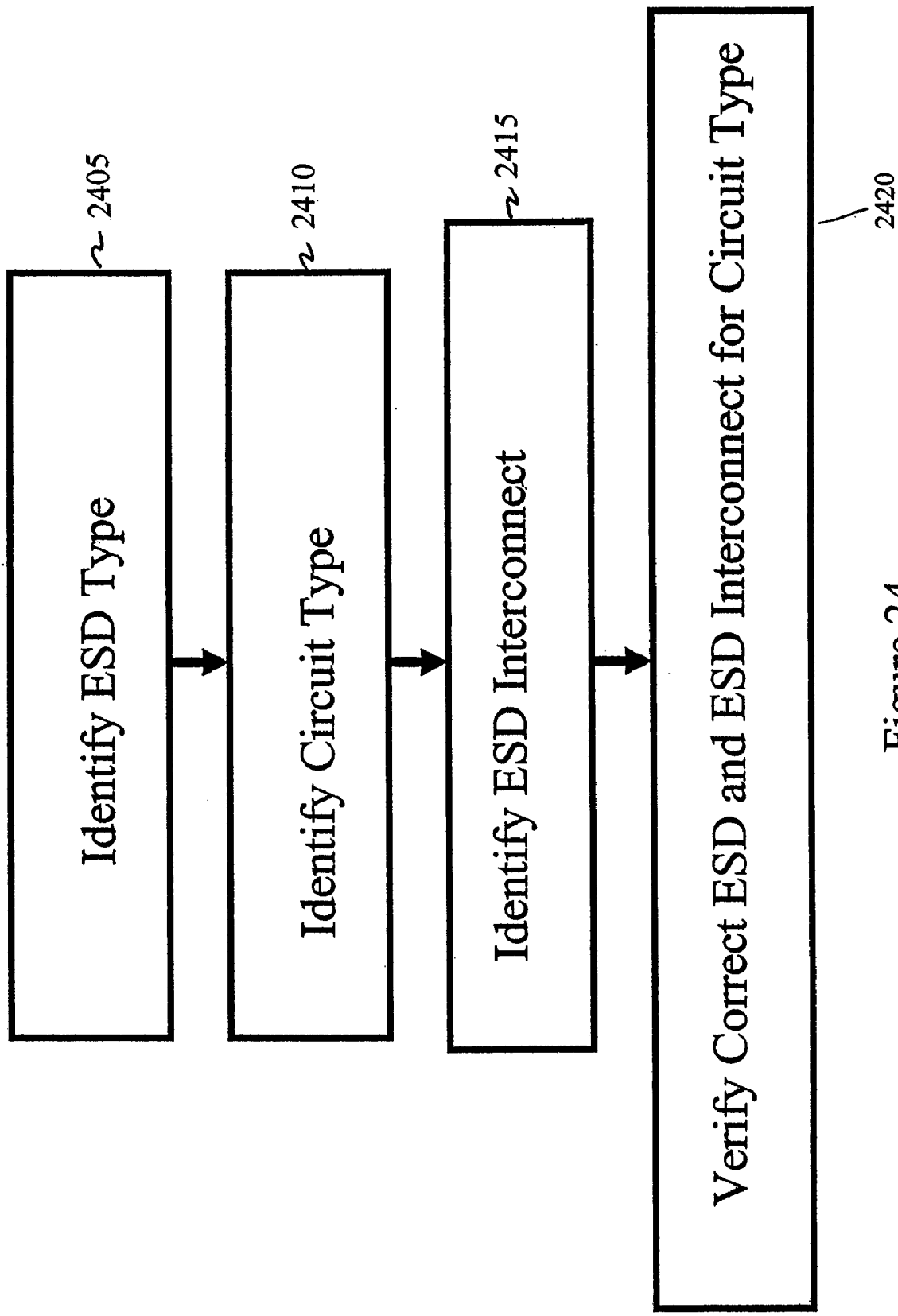

In the implementation of FIG. 24, at step 2405, the flow identifies the ESD type. At step 2410, the flow identifies the circuit type. At step 2415, the flow identifies the ESD Interconnect. At step 2420, the flow verifies that there is a correct ESD and ESD Interconnect for the circuit type.

Figure 27:
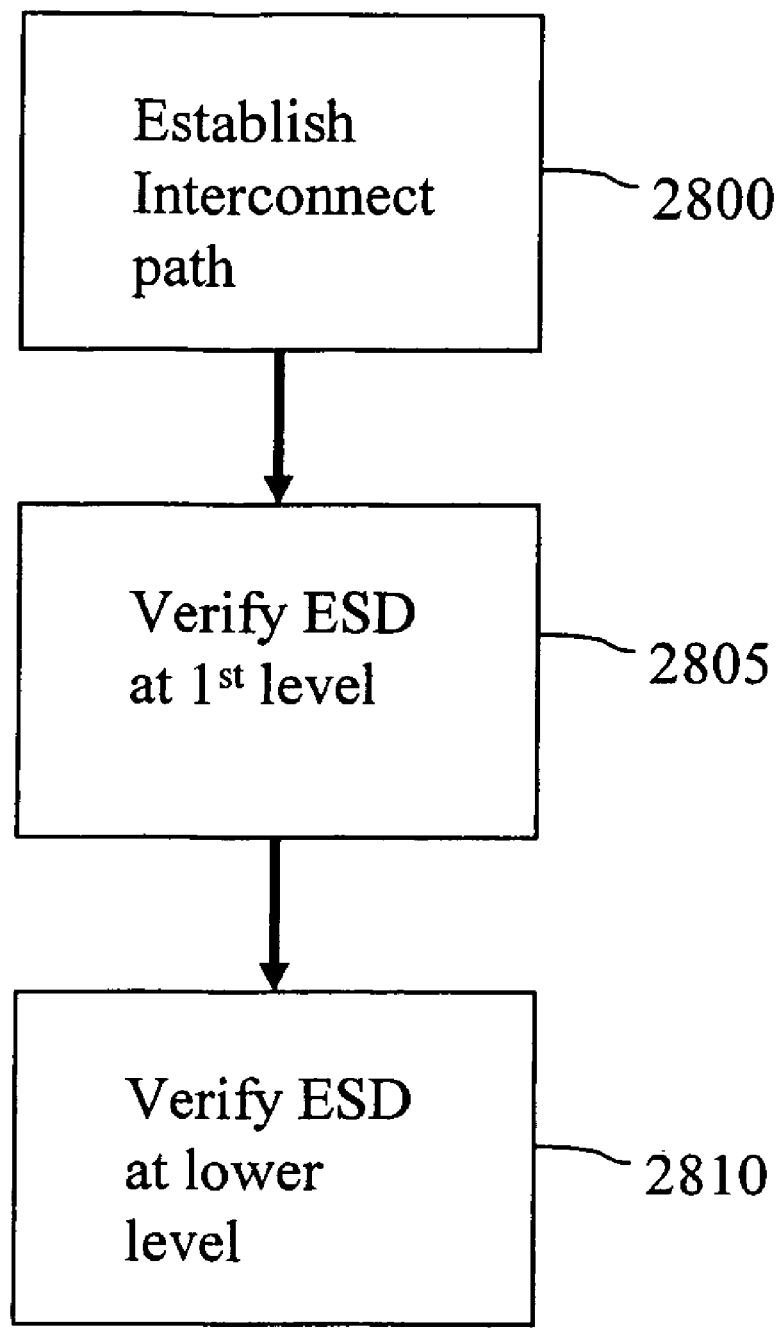
FIG. 27 shows a flowchart implementing a method for verifying the connection between the pad and the ESD network in accordance with the invention.

In this "ESD Interconnect" hierarchical p-cell, item (1) is achieved by the flow of FIG. 27. At step 2800, the flow of the invention establishes the interconnection path of the pad level. At step 2805, the flow verifies an ESD interconnect at that level. At step 2810, the flow verifies a ESD via at the level below. The flow at step 2810 is repeated until the lowest level connects to highest metal design level of the input of the ESD network of the corresponding ESD device to that pad. The "ESD Interconnect" can be a single p-cell which contains multiple levels of metal from pad X to ESD p-cell Y where the system verifies the connectivity.

The p-cell and algorithm can be established which prevents the metal level to go below a given ESD width (item 2). The minimum width can be established by conversion of the metal shape into a p-cell where the metal has an algorithm with a minimum function where the width never goes below a given width defined by the minimum ESD requirement.

Figure 28:
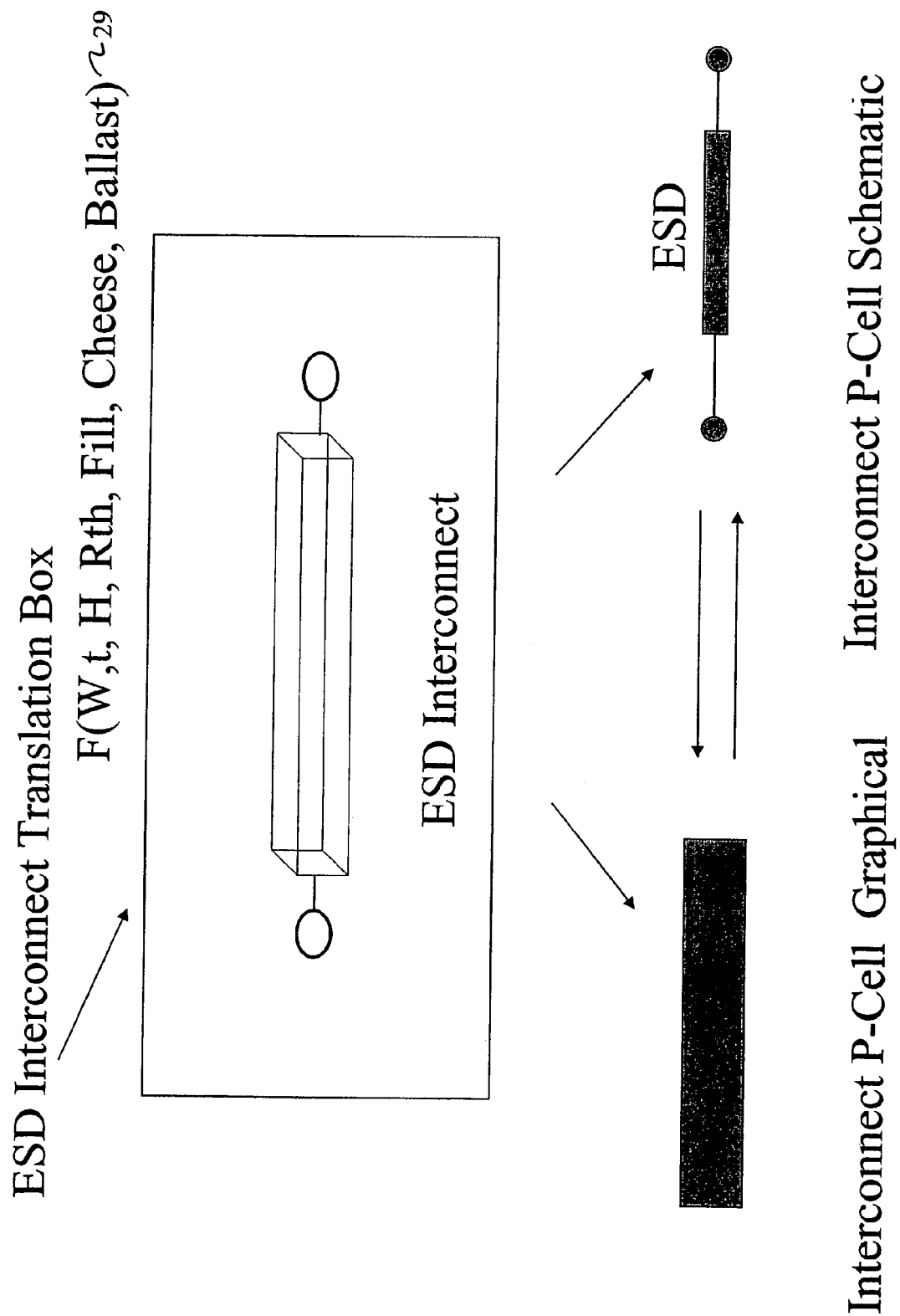
FIG. 28 shows a representation of an ESD Interconnect Translation Box in accordance with the invention.

For item (3), the checking and verification of the correct wire width and via number is never below the ESD robustness level of the circuit can be verified using the information of the inherited parameters contained on the translation box (FIG. 28) formed around the electrical schematic of the hierarchical parameterized cell. The electrical schematic translation box contains the circuit type, the inherited parameters, and pin connections. The translation box may also contain functions 29, including for example, ballasting, fill and cheese. The translation box will allow the transformation of the schematic to the graphical and vice versa. From this, the ESD robustness of the circuit can be determined and stored in the circuit from electrical measurement tables of the design system, as discussed below. Also, from this, the verification that the ESD Interconnect structure p-cell is more ESD robust can be calculated from the ESD robustness wire calculations. The ESD robustness can be addressed based on the knowledge of items (6), item (7) and item (8).

By way of illustration, ESD robustness of an interconnect can be calculated based on the metal level and effective metal width. For example, for a given technology file, the metal film thicknesses and materials are known. For an Aluminum-based interconnect system, a first level metal is 0.5 µm thick, the second level metal is 1 µm thick, and the last level of metal is 2 µmm thick. For a Human body model ESD event, from experimental results, the table of results can be represented as follows:

| Interconnect Type | Design Level | THICKNESS (μm) | HBM ROBUSTNESS |
|---|---|---|---|
| Al/SiO2 | M1 | 0.5 | 500 V/μm |
| Al/SiO2 | M2 | 1.0 | 1000 V/μm |
| Al/SiO2 | M (LAST) | 2.0 | 2000 V/μm |

In this fashion, from the design level, and the technology file, and experimental data, a table is constructed. Also, in this fashion in a "lookup table" which is based on design data and experimental results, the size of the interconnect can be judged as achieving the ESD objective. In the graphical unit interface (GUI), the input variable can choose an ESD model such as HBM. Once the GUI choice is made, the ESD HBM level can then be chosen. For example, if the GUI input is that the HBM level is to be greater than 4000 V, then all interconnects from the pad must be auto-generated to increase to a minimum width of 2 μm of M(Last), 4 μm of M2, and 8 μm of M1 design levels, respectively.

For the case of Copper interconnects, the HBM ESD robustness levels is 2× the Aluminum levels for the same thickness. In this fashion, from the design level, and the technology file, and experimental data, a table is constructed. Also, in a "lookup table" which is based on design data and experimental results, the size of the interconnect can be judged as achieving the ESD objective. In the graphical unit interface (GUI), the input variable can choose an ESD model such as HBM. Once the GUI choice is made, the ESD HBM level can then be chosen. For example, if the GUI input is that the HBM level is to be greater than 4000 V, then all interconnects from the pad must be auto-generated to increase to a minimum width of 1 μm of M(Last), 2 μm of M2, and 4 μm of M1 design levels, respectively.

| Interconnect Type | Design Level | THICKNESS (μm) | HBM ROBUSTNESS |
|---|---|---|---|
| Cu/SiO2 | M1 | 0.5 | 1000 V/μm |
| Cu/SiO2 | M2 | 1.0 | 2000 V/μm |
| Cu/SiO2 | M (LAST) | 2.0 | 4000 V/μm |

In the case of the Machine Model, ESD robustness levels are 5× lower. In this fashion, in a "lookup table" which is based on design data and experimental results, the size of the interconnect can be judged as achieving the ESD objective. In the graphical unit interface (GUI), the input variable can choose an ESD model such as MM. Once the GUI choice is made, the ESD MM level can then be chosen.

In the case that multiple models, such as HBM, MM and CDM levels are required, the design system can be established so that the metal linewidth is such that all models are achieve the desired levels and the minimum thickness is chosen so that all models are satisfied.

Analytical models, such as those developed by Wunsch-Bell, Smith-Littau, Pierce, and Voldman can be utilized for prediction of the critical current or power to failure. Analytical models can be used which require the heat capacity, the thermal conductivity, the melting temperature, and the pulse width of the event can be used instead of empirical look-up tables. In this fashion, the GUI would either store the material properties and/or allow user defined properties that are required for the analytical equation. Using the analytical models, material properties of the metal wire and the insulator properties can be used which will allow predictive capability for a given ESD event. The metal line would then be autogenerated to guarantee non-failure to that ESD event of a given current level, voltage level or pulse width. (See, for example, S. Voldman et. al, "High-Current Transmission Line Pulse characterization of Aluminum and Copper Interconnects for Advanced CMOS Semiconductor Technologies", 1998 IEEE International Reliability Physics Symposium, page 293–301 and S. Voldman et. al, "ESD Robustness and Scaling Implications of Aluminum and Copper Interconnects in Advanced Semiconductor Technology", 1997 EOS/ESD Symposium, page 316–329, both incorporated herein in its entirety.) In the case of filling, the fill shapes change the effective thermal conductivity of the insulator. This can be handled in the analytical models by modifying the effective thermal conductivity of the surrounding medium. In the case of "cheesing", holes are formed in the metal. In this case, the metal width must be increased to allow for the total cross sectional area the same. For example, given a metal line 2 μm wide that requires a 1 μm cheese hole, the metal line must be increased to 3 μm to achieve the same cross sectional area. In the case of ballasting, the metal line can be separated into a plurality of parallel wires where the wire widths are such that the total width is equal to the calculated width based on the analytical model or the lookup table result. Ballasting can be an option or a requirement of a design, or implementation.

FIG. 29a shows a flow for using the lookup table as discussed above. At step 3005, the ESD Failure Model (HBM, MM, CDM, Other) is defined. At step 3010, the ESD desired failure level is defined. At step 3015, the Technology File Data and Level Information (Insulators, Metal Thickness) is placed in the system. At step 3020, the fill requirements for that level are defined. At step 3025, the cheese requirements are defined. At step 3030, the metal linewidth is calculated. At step 3035, the ballast requirements are defined.

FIG. 29b shows a flow chart based on an analytical model. At step 3050, the ESD pulse width is defined. At step 3055, the Electrothermal Model is defined (e.g., Wunsch-Bell, Smith-Littau, Pierce, Voldman). At step 3060, the desired ESD failure rate is defined. At step 3065, the Technology File Data and Level Information (Insulators, Metal Thicknesses) is placed within the system. At step 3070, the fill requirements for that level are defined. At step 3075, the cheese fill requirements are defined. At step 3080, the Metal Linewidth is calculated from the Electrothermal Model. At step 3085, the ballasting requirements are defined.

For addressing plurality of parallel lines and ESD ballasting needs, this can also be addressed by the ESD Interconnect p-cell. In the case where it is a requirement that interconnect ballasting of the ESD device is a critical need, a check can be performed where the lowest level of metal of the ESD Interconnect p-cell is divided into a plurality of interconnects which integrates with the ESD network.

If the ESD network translation (FIG. 28) box contains information that ESD ballasting is required for that specific design, the check then verifies that the ESD interconnect also contains this requirement or design failure is stated. Hence, an ESD Interconnect p-cell can have as a parameter the formation of a plurality of interconnects, and also verifies that this feature is "checked" relative to the ESD network translation box information of the ESD p-cell for the highest level of the p-cell and the lowest level of the ESD Interconnect p-cell.

To verify the presence of ESD power clamps between two power rails, the checking system provides a verification step where the labeled power pads are also connected such that the ESD Interconnect p-cell is utilized for the power grid, and an ESD power clamp. The verification and checking system will check:

1. the presence of the ESD Interconnect p-cell,
2. the interconnection between the power pad and the ESD Interconnect p-cell,
3. the presence of a ESD power clamp, and
4. the type of the ESD power clamp, the size of the ESD power clamp.

In this case, the verification and checking system will verify:

1. the "connectivity" from power pad, ESD interconnect,
2. ESD power clamp, and
3. ESD interconnect and a power ground pad.

Again, the ESD Interconnect will have the features as enumerated in items 1–8, as applicable. Again, the information of the ESD power clamp is contained in the translation mapping box about the physical schematic. From this the ESD robustness of the power clamp information can be compared to the interconnect ESD robustness to verify and check the robustness of the current path.

For between two ground power rails, or a common potential of two separated power supplies, the verification and checking of the ESD rail-to-rail device can be verified against its ESD Interconnect connection. ESD ballasting, ESD robustness, and inherited parameters can be contained on the translation box and stored for cross comparison between the pads, the interconnect and the ESD network.

As are all circuits, high level ESD circuits comprises a plurality of lower level sub-circuits which, in turn, can be expressed in terms of still lower level elements. The lowest level ESD elements may be expressed as simple parameterized cells ("p-cells") such are resistor p-cells, transistor p-cells, varactors p-cells, as well as any other basic electronic component. These, in turn, can be used to express higher level parameterized circuits. These parameterized circuits can, in turn, be connected with parameterized interconnects to ultimately form the ESD circuit.

The p-cells exist is a computer aided design (CAD) environment, and are essentially a computer model of the particular element comprising all of the parameters necessary for the computer to simulate that element. The parameters that define the device itself are fixed while others of the parameters may be defined by the user depending on the needs of the circuit to be designed. For example, the user may be able to enter various parameters such as input voltage, power supply voltage, temperature tolerances, frequency ranges, etc. Parameters may also be auto-generated based on other user input considerations such as power supply ranges, current stress, and desired ESD protection. Higher level p-cells inherit the user defined parameters and autogenerated parameters from the lower level p-cells as shown in the graphical user interface of FIG. 2.

CONCLUSION

With the introduction of the methodology of the invention, some expected and unexpected results have been evident. First, a significant improvement in productivity is evident from implementation of the hierarchical parameterized cell ESD library. Once the family of parameterized cell circuits are compiled and generated, test site development is significantly faster since the inherited parameterized cells allows for rapid generation of the matrix of allowable sizes of the circuit. This provides a productivity improvement in the test site phase. A second advantage is that the designs are completed at the test site phase which allows for direct implementation into the design kit release/verification process at the test site phase of the development cycle. This also allows for early customer implementation at an alpha or beta release of a new released technology library. A third advantage is that the hierarchical parameterized ESD designs do not need unique RF characterization since the designs contain all RF characterized elements. This third advantage provides no additional RF characterization workload and will be updated with all design releases. A fourth advantage is that customers do not continue to request alternate size structures of different form factors after the initial release. An additional advantage of this architecture is that as the design system matures, the number of inherited parameters can be increased to allow increased customer flexibility to address area, form factor, or other issues.

Adding the design implementation to the system is also possible as a technology matures. For example, new parameterized cells can be generated and constructed into different input node ESD networks, rail-to-rail networks or ESD power clamps. Hence, adding custom implemented salicide-blocked MOSFET p-cells, salicide-blocked resistor elements, ballasting elements, and any concept can be constructed. The sub-circuit blocks of these libraries can be used to construct other circuits because of their modular construction. For example, the RC parameterized cell can be used for other implementations and other networks. Another advantage of this methodology is that it is suitable for both RF-CMOS and RF-BiCMOS. The RF-BiCMOS is a super-set of elements; by removal of the bipolar-based networks, an RF CMOS ESD library exists which is compatible with its BiCMOS counterpart. This strategy can save significant time and cost in the development of an RF CMOS technology; new manuals, new ESD design kits, design release or reis not necessary when the architecture of this strategy is such that the BiCMOS implementation serves as the ESD super-set of elements.

While the invention has been described in terms of a single preferred embodiment, those skilled in the art will recognize that the invention can be practiced with modifications within the spirit and scope of the appended claims.

The invention claimed is:

1. A computerized ESD circuit design system, comprising:
    a user interface for inputting a plurality of design parameters of a circuit;
    an ESD kit comprising parameterized cells (p-cells) of low level electronic circuit components and p-cells of higher level electronic circuit components, the higher level electronic circuit components comprising growable and non-growable segments; and
    a circuit schematic module creating ESD elements for connection with the circuit based on the plurality of design parameters and using at least one of the low level electronic circuit components and the higher level electronic circuit components.

2. The computerized ESD circuit design system of claim 1, wherein the circuit schematic module places the ESD elements in the circuit.

3. The computerized ESD circuit design system of claim 1, wherein said low level electronic circuit components and higher level electronic circuit components are in a hierarchical format.

4. The computerized ESD circuit design system of claim 1, wherein the higher level electronic circuit components form repetition groups of an underlying p-cell element to accommodate different inputted design parameters when forming the ESD elements.

5. The computerized ESD circuit design system of claim 1, wherein the p-cells of lower order electronic components fix some variables and pass some variables to the higher order p-cell electronic components through inheritance.

6. The computerized SD circuit design system of claim 1, further comprising a translation module for translating schematic representations of the ESD elements to graphical representations of the ESD elements and translating the graphical representations of the ESD elements to the schematic representations of the ESD elements.

7. The computerized ESD circuit design system of claim 1, further comprising a library containing various types of the ESD elements.

8. The computerized ESD circuit design system of claim 7, further comprising a module for manipulating the ESD elements to conform with a design of the circuit.

9. The computerized ESD circuit design system of claim 7, further comprising a pointer to the various types of the ESD elements in the library.

10. The computerized ESD circuit design system of claim 7, wherein the various types of the ESD elements are preset or user designed.

11. The computerized ESD circuit design system of claim 1, wherein the circuit schematic module creates one of a symbol and a schematic of the ESD elements.

12. The computerized ESD circuit design system of claim 1, further comprising a graphical seed module for creating a graphical seed of at least the ESD elements and the circuit.

13. The computerized ESD circuit design system of claim 12, wherein the graphical seed module includes functions of at least one of:
(i) Stretch,
(ii) Conditional Inclusion,
(iii) Repetition,
(iv) Parameterized shapes,
(v) Repeat along shape,
(vi) Reference point,
(vii) Inherited Parameters,
(viii) Parameterized Layer,
(ix) Parameterized Label,
(x) Parameterized Property,
(xi) Parameters, and
(xii) Compile.

14. The computerized ESD circuit design system of claim 12, wherein the graphical seed module creates a graphical representation of the circuit and the designed ESD element for future fabrication.

15. The computerized ESD circuit design system of claim 1, wherein the circuit schematic module creates a boundary about the ESD elements containing circuit information and places the schematic within the circuit design.

16. The computerized ESD circuit design system of claim 1 further comprising a module for providing modification of ESD interconnect parameterized cells based on information of the higher level electronic circuit components.

17. The computerized ESD circuit design system of claim 16, wherein said circuit schematic module provides a static p-cell substantiation translator box used for comparison of the ESD interconnect parameterized cell and robustness of the ESD kit.

18. The computerized ESD circuit design system of claim 16, further comprising a component to identify and verify a connection of at least one of a circuit type, the ESD interconnect parameterized cell, ESD type and a pad.

19. The computerized ESD circuit design system of claim 1, further comprising:
a cell substantiation translator module for identifying which components are part of the higher level electronic circuit components;
a module for eliminating and preserving all of the higher level electronic circuit components in the cell substantiation translator module; and
a module for re-generation of all graphical information from the cell substantiation translator module based on the preserved higher level electronic circuit components for graphically representing the circuit and ESD elements.

20. The computerized ESD circuit design system of claim 1, further comprising a component to establish an interconnection path of a pad level for an input pad and to verify an ESD interconnect at the pad level.

21. The computerized ESD circuit design system of claim 1, wherein a p-cell is established which prevents a metal level to go below a given ESD width where a minimum width is established by conversion of a metal shape into the p-cell where the metal has an algorithm with a minimum function where the width never goes below a given width defined by a minimum ESD requirement.

22. The computerized ESD circuit design system of claim 1, wherein the low level electronic circuit components comprise growable and non-growable segments.

23. The computerized ESD circuit design system of claim 1, wherein the circuit schematic module creating ESD elements for connection with the circuit based on the plurality of design parameters uses each of the low level electronic circuit components and the higher level electronic circuit components.

24. The computerized ESD circuit design system of claim 1, wherein the system auto-wires ESD elements to create the circuit.

25. The computerized ESD circuit design system of claim 1, wherein the system generates a schematic/symbol representation of the circuit and simulates the ESD elements that are placed and wired.

26. The computerized ESD circuit design system of claim 1, wherein one of the p-cells is an ESD interconnect that provides ESD robustness.

27. The computerized ESD circuit design system of claim 26, wherein the ESD interconnect is a hierarchical p-cell.

28. The computerized ESD circuit design system of claim 26, wherein the ESD interconnect comprises a metal film.

29. The computerized ESD circuit design system of claim 1, wherein the ESD elements are one of: resistor p-cells; transistor p-cells; and varactor p-cells.

30. A computerized ESD circuit design system, comprising:
a user interface for inputting a plurality of design parameters of a circuit;
an ESD kit comprising parameterized cells (p-cells) of low level electronic circuit components and p-cells of higher level electronic circuit components, the higher level electronic circuit components comprising growable and non-growable segments; and
a circuit schematic module creating ESD elements for connection with the circuit based on the plurality of design parameters and using each of the low level electronic circuit components and the higher level electronic circuit components.

31. A computerized ESD circuit design system, comprising:

a user interface for inputting a plurality of design parameters of a circuit;

an ESD kit comprising parameterized cells (p-cells) of low level electronic circuit components and p-cells of higher level electronic circuit components, the lower and higher level electronic circuit components comprising growable and non-growable segments; and a circuit schematic module creating ESD elements for connection with the circuit based on the plurality of design parameters and using each of the low level electronic circuit components and the higher level electronic circuit components.

* * * * *